(12) United States Patent
Lopez et al.

(10) Patent No.: US 11,462,666 B2
(45) Date of Patent: Oct. 4, 2022

(54) LIGHT-EMITTING DEVICE WITH CONFIGURABLE SPATIAL DISTRIBUTION OF EMISSION INTENSITY

(71) Applicant: LUMILEDS LLC, San Jose, CA (US)

(72) Inventors: Toni Lopez, Aachen (DE); Floris Crompvoets, Aachen (DE)

(73) Assignee: Lumileds LLC, San Jose, CA (US)

( * ) Notice: Subject to any disclaimer, the term of this patent is extended or adjusted under 35 U.S.C. 154(b) by 179 days.

(21) Appl. No.: 16/875,237

(22) Filed: May 15, 2020

(65) Prior Publication Data

US 2021/0359179 A1 Nov. 18, 2021

(51) Int. Cl.
| | |
|---|---|
| *H01L 33/62* | (2010.01) |
| *H01L 33/38* | (2010.01) |
| *H01L 33/60* | (2010.01) |
| *H01L 25/075* | (2006.01) |

(52) U.S. Cl.
CPC .......... *H01L 33/62* (2013.01); *H01L 25/0753* (2013.01); *H01L 33/382* (2013.01); *H01L 33/60* (2013.01)

(58) Field of Classification Search
CPC ........ H01L 33/62; H01L 33/382; H01L 33/60
See application file for complete search history.

(56) References Cited

U.S. PATENT DOCUMENTS

| | | | |
|---|---|---|---|
| 8,754,425 B2 | 6/2014 | Anderson et al. | |
| 2010/0213485 A1 | 8/2010 | McKenzie et al. | |
| 2011/0210362 A1 | 9/2011 | Lee et al. | |
| 2012/0051075 A1 | 3/2012 | Harada et al. | |
| 2012/0051079 A1 | 3/2012 | Saito et al. | |
| 2014/0151739 A1* | 6/2014 | Koizumi | H01L 33/50 257/98 |
| 2016/0284927 A1 | 9/2016 | Cho et al. | |
| 2017/0210277 A1 | 7/2017 | Harada et al. | |

(Continued)

FOREIGN PATENT DOCUMENTS

| | | |
|---|---|---|
| EP | 284618 A2 | 4/2013 |
| EP | 2584618 A2 | 4/2013 |

(Continued)

OTHER PUBLICATIONS

Compound Semiconductor, "SiC MOSFETs", www.compoundsemiconductor.net, vol. 23 Issue 2, Mar. 2017, 10 pages.

(Continued)

*Primary Examiner* — Feifei Yeung Lopez

(57) ABSTRACT

A semiconductor light-emitting device includes a junction between doped semiconductor layers, a first set of multiple independent contacts connected to a first doped layer and a second set of one or more contacts connected to the second doped layer. Multiple conductive vias connect the independent contacts to the first doped layer, enabling differing corresponding via currents to be applied to the first doped layer through the vias independent of one another. A spatial distribution of via currents among the multiple vias can be selected to yield a corresponding spatial distribution of emission intensity. Alteration of the via current distribution results in corresponding alteration of the emission intensity distribution; such alterations can be implemented dynamically.

24 Claims, 14 Drawing Sheets

(56) References Cited

U.S. PATENT DOCUMENTS

2017/0236866 A1    8/2017  Lee et al.
2020/0287088 A1*  9/2020  Jeon ..................... H01L 33/325
2021/0358997 A1  11/2021  Lopez et al.

FOREIGN PATENT DOCUMENTS

| EP | 3182451 A1 | | 6/2017 |
|----|---|---|---|
| KR | 10-2011-0085726 A | | 7/2011 |
| KR | 10-1494331 B1 | | 2/2015 |
| WO | 2014/105403 A1 | | 7/2014 |
| WO | PCTKR2017000152 | * | 7/2017 |

OTHER PUBLICATIONS

The extended European search report corresponding to EP 20180007.5 dated Nov. 12, 2020, 10 pages.

From the Korean Intellectual Property Office as the ISA, "Notification of Transmittal of the International Search Report and the Written Opinion of the International Searching Authority, or the Declaration", corresponding to PCT/US2021/032312, dated Aug. 31, 2021, 11 pages.

* cited by examiner

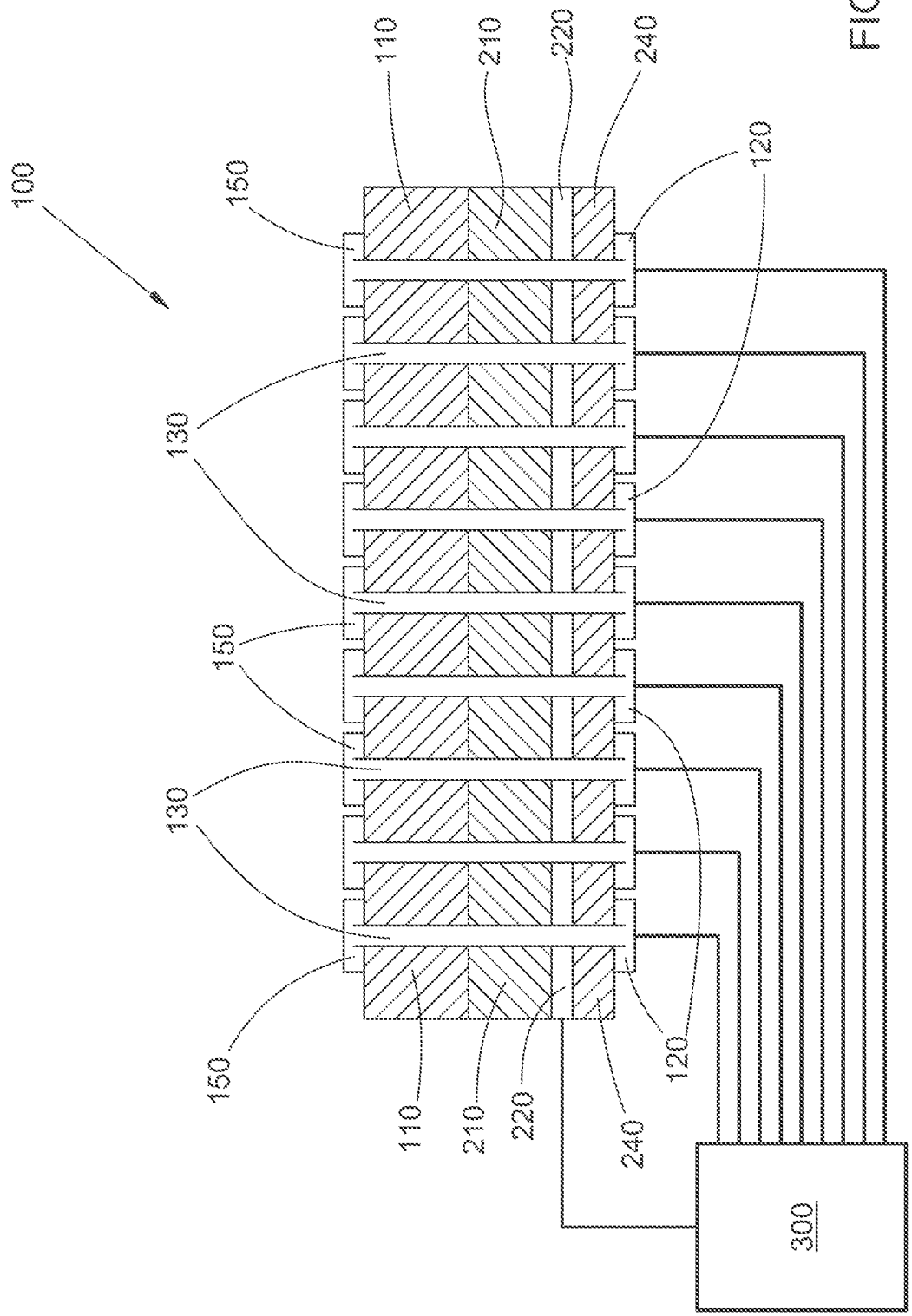

LIGHT-EMITTING DEVICE WITH CONFIGURABLE SPATIAL DISTRIBUTION OF EMISSION INTENSITY

FIELD OF THE INVENTION

The field of the present invention relates to light-emitting devices (LEDs). In particular, apparatus and methods are disclosed for configuring a spatial distribution of light emission intensity produced by a semiconductor LED.

BACKGROUND

It is desirable in certain illumination applications (e.g., automotive headlights) to employ semiconductor light-emitting devices (LEDs) that exhibit a specified spatial distribution of emission intensity. For example, low-beam automotive headlights have been observed to exhibit desirable beam intensity profiles when employing LEDs with an intensity distribution having a maximum near one edge of the device and decreasing monotonically toward the opposite edge of the device (referred to herein as a sloped intensity distribution). In another example, high-beam automotive headlights are observed to exhibit desirable bean intensity profiles when employing LEDs with an intensity distribution having a maximum in a central region of the device and decreasing toward the edges of the device (referred to herein as a 2D-peaked intensity distribution). Other intensity distributions can be advantageously employed in other use applications, including automotive and non-automotive applications.

Several examples of LEDs have been disclosed previously that can produce specified intensity distributions. Some of those are disclosed in:

EP 3 182 451 published 21 Jun. 2017 in the name of Stanley Electric Co Ltd;
EP 2 584 618 published 24 Apr. 2013 in the name of Stanley Electric Co Ltd;
US 2012/0051075 published 1 Mar. 2012 in the name of Harada;
US 2012/0051079 published 1 Mar. 2012 in the name of Saito; and
US 2017/0210277 published 27 Jul. 2017 in the name of Harada.

In some of those conventional examples, a so-called flip-chip LED 10 can be employed having n- and p-contacts 12 and 14 connected to n- and p-doped layers 11 and 13, respectively, and connected to a drive circuit 20. Current from the drive circuit 20 flows through the contacts 12/14, and light is emitted from the p-n junction and exits through the n-doped layer 11 of the device 10; the general arrangement is shown in the schematic cross-sectional view of FIG. 8. The metal p-contact 14 acts as an optical reflector. The n-contact 12 is separated from the p-contact 14 by an insulating layer 18. Multiple conductive vias 16 connect the n-contact 12 to the n-doped layer 11 of the device 10 through the insulating layer 18, the p-contact 14, and the p-doped layer 13. The vias 16 that connect to the n-doped layer 11 through the p-doped layer 13 are often referred to as n-vias. The vias 16 are electrically insulated from the p-contact 14 and the p-doped layer 13. To achieve a desired spatial distribution of emission intensity, the sizes and/or local number density of the vias 16 can vary with transverse position across the device 10, resulting in carrier recombination density through the device that varies with transverse position (e.g., higher local number density (equivalently, smaller via spacing) or larger size of vias 16 resulting in higher local carrier recombination density). That position-dependent carrier recombination density in turn yields a position-dependent emission intensity.

SUMMARY

An inventive semiconductor light-emitting device (LED) includes first and second doped semiconductor layers, first and second sets of electrically conductive contacts, and an array of multiple electrically conductive vias. The first and second doped semiconductor layers are arranged for emitting light resulting from carrier recombination at a junction between them. The first set of contacts includes multiple independent electrically conductive contacts each electrically connected to the first doped semiconductor layer; the second set of contacts includes one or more electrically conductive contacts each electrically connected to the second doped semiconductor layer. The array of multiple electrically conductive vias is arranged across the device and connects contacts of the first set to the first doped semiconductor layer. Each via connects at most one corresponding contact of the first set to the first doped semiconductor layer, and provides a corresponding discrete, localized, circumscribed electrical connection between the first doped semiconductor layer and the corresponding contact of the first set.

In some examples, the first doped semiconductor layer is between the first set of contacts and the second doped semiconductor layer, and the device includes an electrically insulating layer between the first doped semiconductor layer and the first set of contacts. In such examples the vias connect contacts of the first set to the first doped semiconductor layer through the insulating layer. In some other examples, the second doped semiconductor layer is between the first set of contacts and the first doped semiconductor layer, and the device includes an electrically insulating layer between the second doped semiconductor layer and the first set of contacts. In such examples the vias connect contacts of the first set to the first doped semiconductor layer through the insulating layer and the second doped semiconductor layer, and are electrically insulated from the second doped semiconductor layer.

The inventive light-emitting device can further include a drive circuit connected to the first and second sets of contacts. The drive circuit can provide electrical drive current that flows through the device and causes the device to emit light, with corresponding portions of the electrical drive current flowing through one or more vias of the array as corresponding via currents. Each via current magnitude can differ from at least one other via current magnitude. The drive circuit can provide one or more specified spatial distributions across the device of the via current magnitudes provided to the corresponding vias of the array. In such examples the spatial distribution of light emission intensity varies across the device according to the arrangement of the array of vias across the device and the specified distribution among the vias of the array of the via current magnitudes provided by the drive circuit.

Another inventive light-emitting apparatus includes n-doped and p-doped semiconductor layers, first and second sets of electrically conductive contacts, and an array of multiple electrically conductive vias. The n-doped and p-doped semiconductor layers are arranged for emitting light resulting from carrier recombination at a junction between them. The first set of contacts includes one or more electrically conductive contacts each electrically connected to the p-doped semiconductor layer; the second set contacts includes one or more electrically conductive contacts each electrically connected to the n-doped semiconductor layer. The array of multiple electrically conductive vias is arranged across the device and connects contacts of the first set to the p-doped semiconductor layer. Each via provides a corresponding discrete, localized, circumscribed electrical connection between the p-doped semiconductor layer and the corresponding contact of the first set. The array of vias is arranged across the device so that one or both of via local number density or via transverse area varies according to position across the device and results in a corresponding spatial distribution of light emission intensity that varies across the device according to the arrangement of the array of vias.

Objects and advantages pertaining to light-emitting devices may become apparent upon referring to the example embodiments illustrated in the drawings and disclosed in the following written description or appended claims.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

FIG. 2A, FIG. 2B, FIG. 2C and FIG. 2D are schematic side cross-sectional views of a second group of example arrangements of an inventive light-emitting device.

Figure 1A:
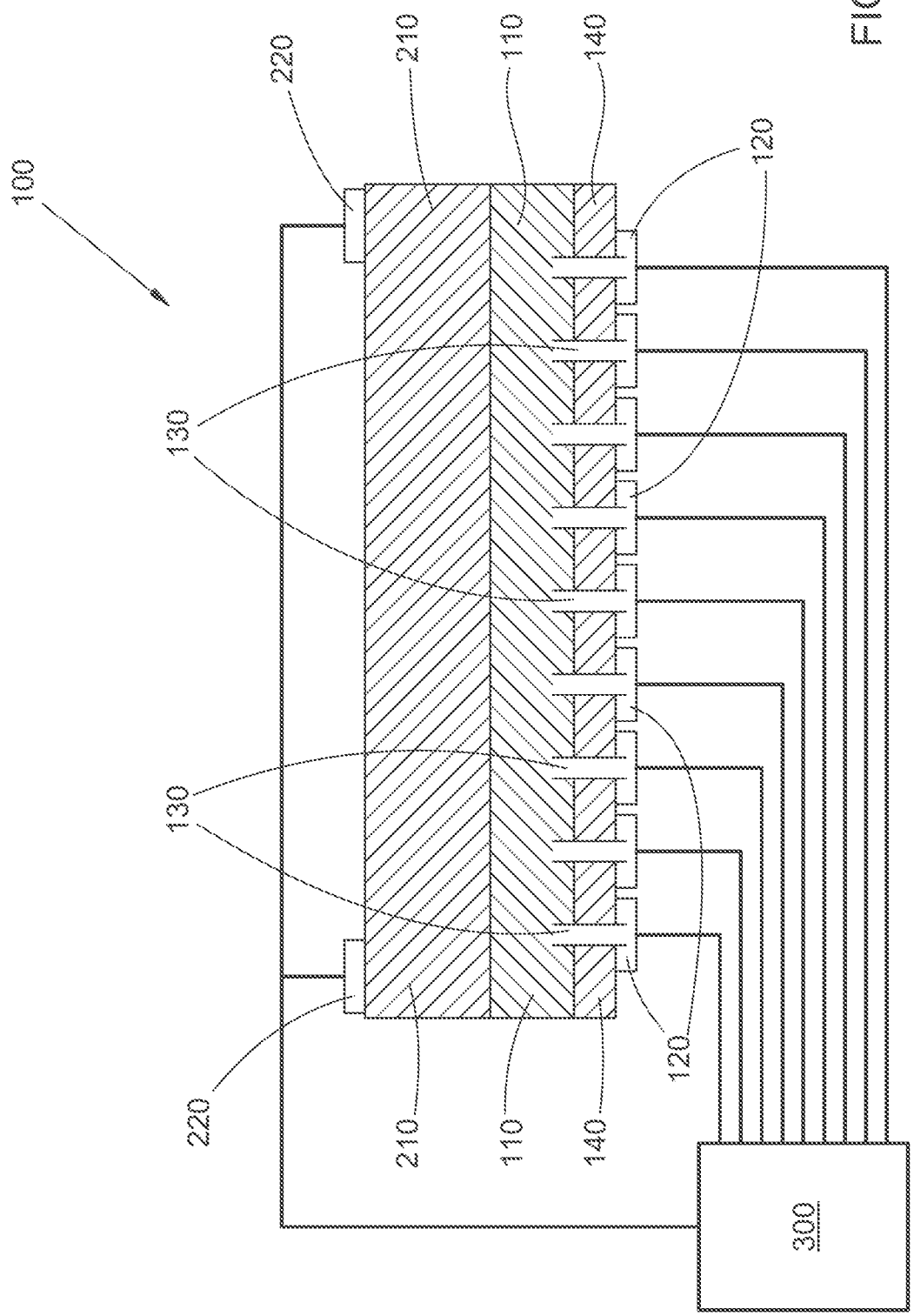
FIG. 1A, FIG. 1B, FIG. 1C and FIG. 1D are schematic side cross-sectional views of a first group of example arrangements of an inventive light-emitting device.

The embodiments depicted are shown only schematically and greatly simplified; all features may not be shown in full detail or in proper proportion; for clarity certain features or structures may be exaggerated or diminished relative to others or omitted entirely; the drawings should not be regarded as being to scale unless explicitly indicated as being to scale. For example, the actual light-emitting devices depicted as having only a handful of vias might have many more vias than are shown; the number of vias may be reduced in the drawings for clarity. In addition, the height, depth, or width of each layer, contact, via, electrode, or other structure often can be exaggerated relative to one another for clarity. In addition, various layers that are spanned by a via and therefore appear discontinuous in the various cross-sectional views should be assumed to be continuous across the device (except for the localized, circumscribed interruptions by the vias) unless explicitly described otherwise. The embodiments shown are only examples and should not be construed as limiting the scope of the present disclosure or appended claims.

DETAILED DESCRIPTION OF EMBODIMENTS

Figure 8:
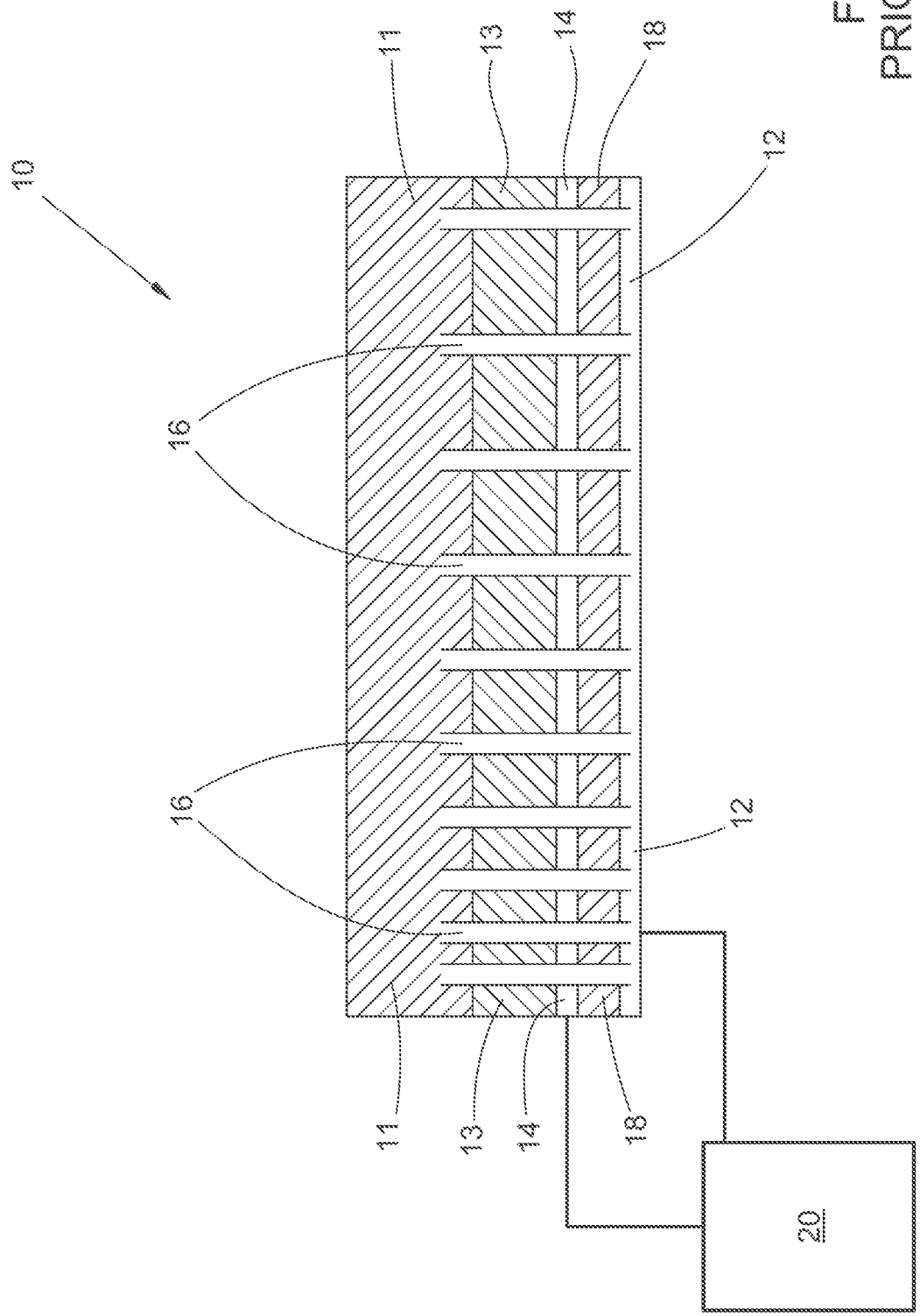
FIG. 8 is a schematic side cross-sectional view of an example of a conventional light-emitting device.

As noted above, a conventional semiconductor light-emitting device 10 (e.g., as in FIG. 8) can include a set of conductive vias 16 that connect an n-contact 12 to the n-doped layer 11 of the device 10. The vias 16 are connected directly to one another by all being connected to the conductive n-contact 12. Transverse size and or local number density of the vias 16 can vary with transverse position across the device 10. For a given drive signal level, applied by the drive circuit 20 through the n-contact 12 and thence to all of the vias 16, local carrier recombination density through the device 10 varies as a function of position across the device due to the variation of size or number density of the vias 16. Spatial distribution of local carrier recombination density in turn determines the spatial distribution of emission intensity. A distribution of sizes and positions of the vias 20 can be selected that produces the desired spatial distribution of carrier recombination density.

While useful, the arrangement described above has a number of drawbacks. First, structural features formed by spatially selective material processing techniques (e.g., epitaxy or lithography) can become less reproducible or reliable as feature sizes decrease (e.g., as vias get smaller to reduce local carrier recombination density or spacing between them gets smaller to increase local carrier recombination density). For example, that can limit a practicably achievable dynamic range of light emission intensity that can be realized across the device. Second, once fabricated, the spatial distribution of light emission of a given device is fixed. If multiple different emission distributions are desired, multiple corresponding light-emitting devices must be provided, with each one producing only one of the desired emission distributions. That leads to inefficiencies of two types. A device manufacturer must fabricate and inventory multiple different types of light-emitting devices to cover different desirable emission distributions. A device user that requires multiple different emission distributions in a single apparatus (e.g., for both low and high beams in an automotive headlight) must design that apparatus to include multiple light emitting devices, driving up cost and complexity of the apparatus. Therefore it would be desirable to provide a light-emitting device that can provide multiple different spatial emission distributions.

Examples of inventive semiconductor light-emitting devices 100 (LEDs) are illustrated schematically in FIGS. 1A-1D and 2A-2D. An inventive semiconductor light-emitting device 100 includes first and second doped semiconductor layers 110 and 210, respectively, a first set of electrically conductive contacts 120, a second set of electrically conductive contacts 220, and an array of electrically conductive vias 130. The first and second doped semiconductor layers 110/210 are arranged for emitting light resulting from carrier recombination at a junction between them. The junction can be of any type or arrangement suitable for generating light in response to current passing through the device 100 under forward-biased conditions. In some examples the junction can include one or more active semiconductor layers or one or more quantum wells. Any one or more suitable semiconductor materials can be employed for the first doped semiconductor layer 110, the second doped semiconductor layer 210, and the active layers or quantum well(s) (if present). In many examples one or more doped III-V semiconductor materials or alloys thereof can be employed to form the first and second doped semiconductor layers 110/210. In many examples that include one or more active layers or quantum wells, those can include one or more doped or undoped III-V semiconductor materials or alloys thereof. The light produced typically is emitted mainly through the doped semiconductor layer 110 or 210 that is farthest from the contacts 120; some emitted light propagates directly from the junction between the doped layers 110/210, while some of the light undergoes one or more reflections within the device 100 before being emitted. The device 100 can include any one or more additional layers, substrates, or structures on its emission side for any one or more suitable purposes (e.g., reduction of reflection; wavelength conversion; collimation, focusing, diffusion, scattering, or other redirection of emitted light; and so forth). The device 100 can be a free-standing structure, or can be formed on any suitable solid substrate (typically with the substrate on the side of the device 100 opposite the contacts 120, and therefore typically transparent for the emitted light). In some instances the device 100 can include conductive bond pads or other similar structures (not shown) connected to the contacts 120 or 220 and arranged for mounting the device 100 to a circuit board or similar structure that provides connections to a drive circuit 300 (described below). Additional conductive or insulating layers that might be employed are omitted from the drawings for clarity.

The first set of contacts 120 includes multiple independent electrically conductive contacts 120 each electrically connected to the first doped semiconductor layer 110. "Independent" contacts are defined herein as being spatially separated from one another so that there is no direct electrical conduction between them; any electrical connections between two independent contacts can only occur indirectly, e.g., by both being connected to the first doped semiconductor layer 110, to an electrode 150 (described below), or to a drive circuit 300 (described below). The second set of contacts 220 includes one or more electrically conductive contacts 220 each electrically connected to the second doped semiconductor layer 210. The array of vias 130 includes multiple electrically conductive vias 130 arranged across the device 100. The vias 130 of the array connect the contacts 120 of the first set to the first doped semiconductor layer 110, with each via 130 connecting at most one corresponding contact 120 of the first set to the first doped semiconductor layer 110. Each via 130 provides a corresponding discrete, localized, circumscribed electrical connection between the first doped semiconductor layer 110 and the corresponding contact 120 of the first set. Any suitable electrically conductive material can be employed to form the contacts 120/220 and the vias 130; in many examples, the contacts 120/220 and the vias 130 can include one or more metals or metal alloys.

In some examples, the transverse sizes of the vias 130 can vary among the vias 130, or the local number density of the vias 130 can vary with position across the device 100. Such variation can contribute to achieving a desired light emission spatial distribution (described further below). In some examples, it may be advantageous for the array of vias 130 to be arranged across the device 100 as a substantially regular grid of substantially identical vias 130. A "regular grid" is defined herein as an arrangement in which the vias 130 occupy positions of a repeating unit cell; the unit cells of the regular grid can be of any suitable size or shape (e.g., square, rectangular, triangular, hexagonal), and can include any suitable number of vias 130 per unit cell, provided that the size, shape, and number are constant for all unit cells of the regular grid. One simple example would be a rectangular grid with a one via 130 per unit cell at the center of each rectangle; other suitable grid arrangements can be employed. Using a regular grid of substantially identical vias 130, variations arising from fabrication of differing feature sizes are substantially eliminated: each via 130 has the same transverse dimensions, and is the same distance from its nearest neighbors, as all the other vias 130 of the array. Achieving variation of the emitted light intensity across the device, using identical, uniformly spaced vias 130, is described further below, and relies on the independence of the contacts 120. An inventive light emitting device 100 can be of any suitable or desirable transverse dimensions and can include suitable or desirable number of vias 130. Some typical devices can have transverse dimensions from several hundred microns to a few millimeters, and can have arrays of vias that include, e.g., 4×4 n-vias up to 10×10 n-vias or more (more generally, n×m where n and m can differ), or 10×10 so-called e-vias (connecting an electrode layer to a p-contact through an insulating layer) up to 50×50 e-vias or more.

Instead of relying solely upon variation among the vias 130 of size or local their number density or spacing to achieve spatial variation of the emitted light intensity distribution, in the inventive device 100 the independent contacts 120 are employed to provide differing corresponding via currents that flow between the first doped semiconductor layer 110 and the contacts 120 through the vias 130. In some examples, each contact 120 of the first set is connected to at most one corresponding via 130 of the array. Such an arrangement enables individual control over current flowing through each via 130 independent of the currents flowing through the other vias 130, and provides the highest spatial resolution for controlling local carrier recombination density through the device 100 for a given arrangement of the vias 130. In other examples, one or more contacts 120 of the first set can be each connected to multiple corresponding vias 130 of the array. A subset of vias 130 that are attached to the same contact 120 can only be controlled together by altering the total current that flows through the contact 120 and is divided among the vias 130 connected to that contact 120.

FIGS. 1A-1D and 2A-2D illustrate two general example arrangements for an inventive light-emitting device 100. In the example general arrangement shown in FIGS. 1A-1D, the first doped semiconductor layer 110 is between the first set of contacts 120 and the second doped semiconductor layer 210, and an electrically insulating layer 140 is between the first doped semiconductor layer 110 and the first set of contacts 120. The vias 130 connect contacts 120 of the first set to the first doped semiconductor layer 110 through the insulating layer 140. In some examples that are thus arranged, the first doped semiconductor layer 110 can be a p-doped layer and the second doped semiconductor layer 210 can be an n-doped layer. The insulating layer 140 can include any one or more suitable materials; in some examples the insulating layer 140 includes doped or undoped silica. In some examples arranged as in FIGS. 1A-1D, the contacts 120 can be metal contacts, and the contacts 120 and the insulating layer 140 can be arranged so as to act as a composite optical reflector for light emitted by the device 100. The metallic contacts 120 often can be lossy as reflectors; the presence of the insulating layer 140 reflects at least some of the light propagating within the layers 110/210 before reaching the contacts 120, thereby reducing optical loss. In some examples (e.g., as in FIG. 1A), the vias 130 are connected directly to the first doped semiconductor layer 110. In some examples (e.g., as in FIGS. 1B-1D), an electrode layer 150 is between the first doped semiconductor layer 110 and the insulating layer 140, and is in direct contact with the first doped semiconductor layer 110. The electrode layer 150 is substantially transparent for light emitted by the device 100, and the vias 130 (arranged as e-vias in these examples) connect the first doped semiconductor layer 110 to the contacts 120 by connecting the electrode layer 150 to the contacts 120. The electrode layer 150 can include any one or more suitable materials; in some examples indium tin oxide (ITO) or indium zinc oxide (IZO) can be employed. In some examples (e.g., as in FIG. 1B), the electrode 150 can be a single contiguous layer spanning most or nearly all of the device 100 (except for, e.g., other vias that pass through it, if present).

Figure 1B:
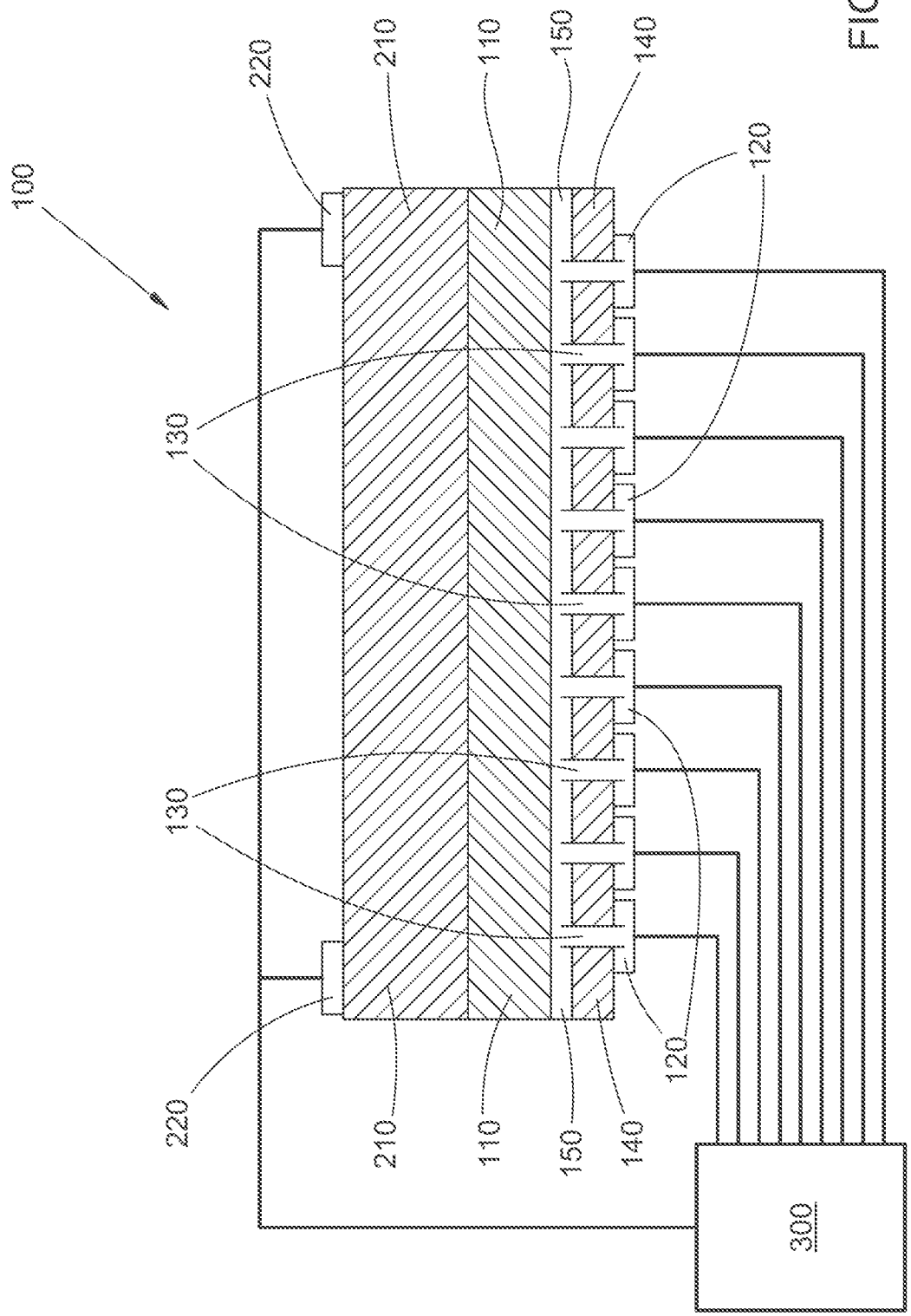
Figure 1C:
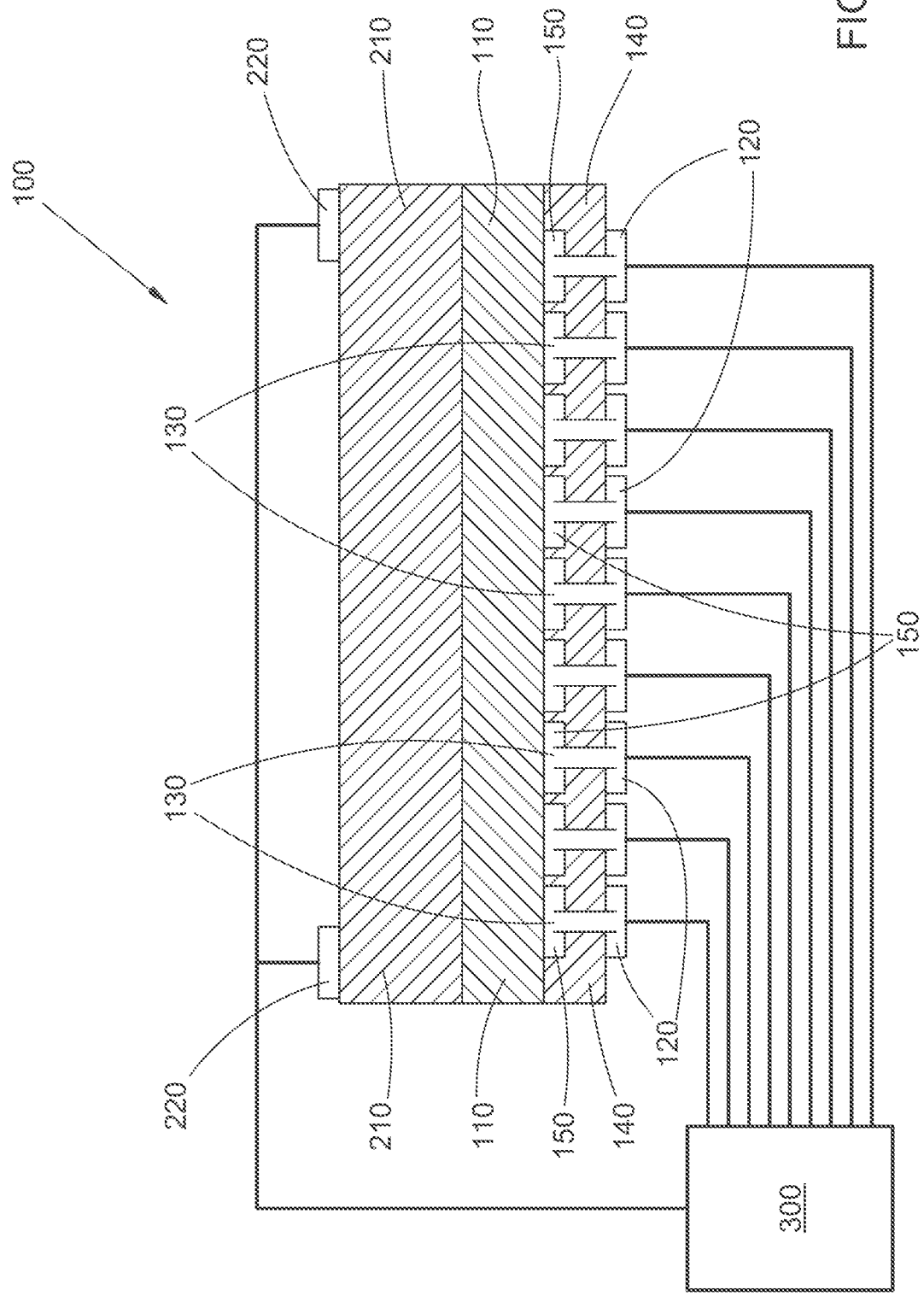
Figure 1D:
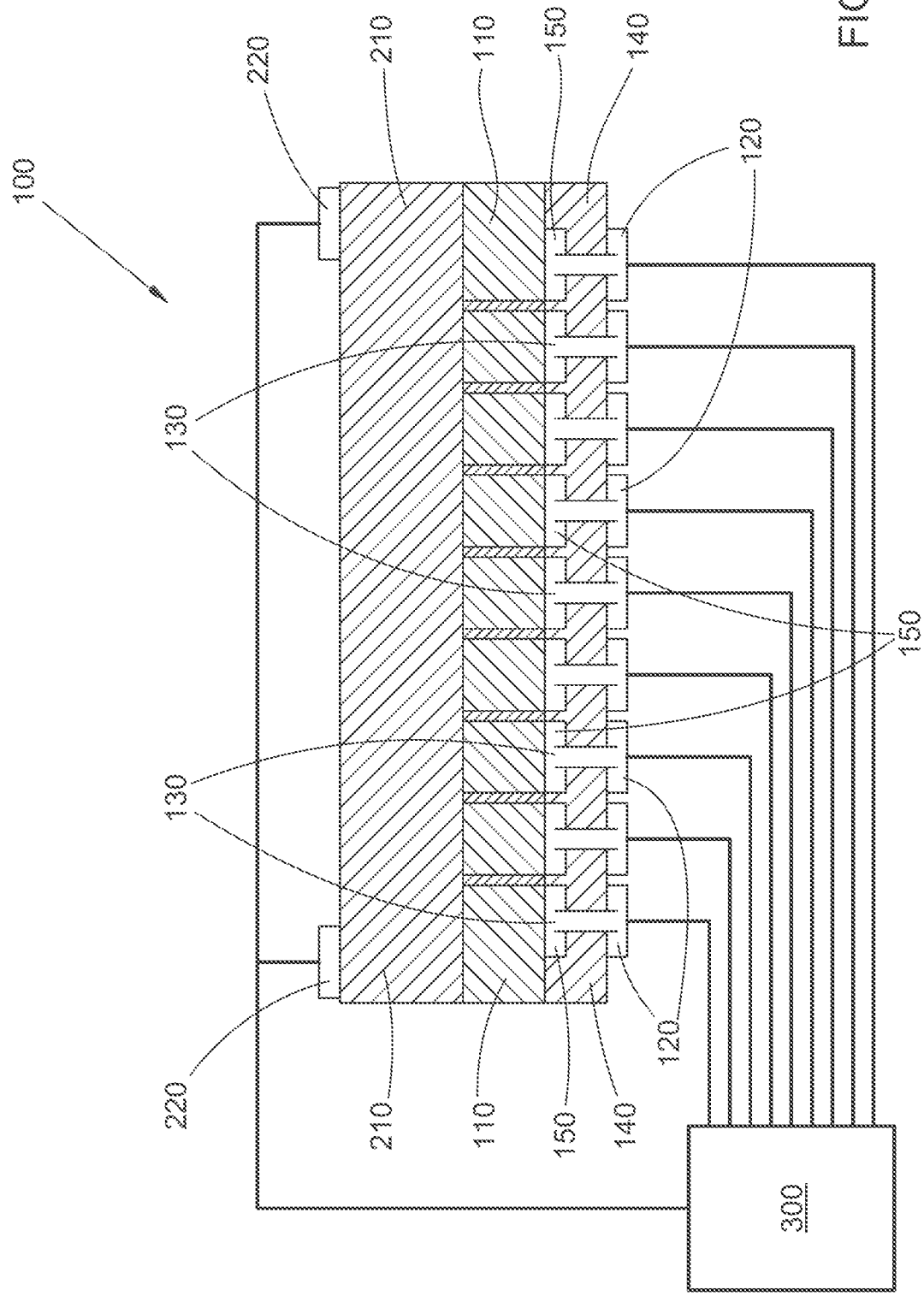

In other examples (e.g., as in FIGS. 1C and 1D), it can be desirable to arrange the electrode layer 150 as multiple discrete areal segments separated by electrically insulating material, thereby substantially preventing transverse electrical conduction between adjacent areal segments of the electrode layer 150. In some examples that include such an arrangement, each areal segment of the electrode layer 150 can be connected to at most one corresponding contact 120 by one or more corresponding vias 130; in other examples that include such an arrangement, each areal segment of the electrode layer 150 can be connected to multiple different contacts 120 by corresponding vias 130. The segmentation of the electrode layer 150 can enhance the spatial resolution of the carrier recombination spatial distribution provided by the vias 130, by somewhat limiting the transverse movement of charge carriers to or from any given via 130 to the area occupied by the corresponding areal segment of the electrode layer 150. In the examples of FIGS. 1A-1C, the first doped semiconductor 110 can be a single contiguous layer spanning most or nearly all of the device 100. Further enhancement of spatial resolution can be achieved in some examples (e.g., as in FIG. 1D), by division of the first doped semiconductor layer 110 into multiple discrete areal segments separated by electrically insulating material. In such an arrangement movement of charge carriers between a given contact 120 and the junction is confined transversely by insulating material separating the corresponding areal segments of the electrode layer 150 and the first doped semiconductor layer 110 from adjacent segments. If suitable or desirable, in some examples the second doped semiconductor layer 210 can be similarly divided into discrete areal segments (not shown).

In the example general arrangement shown in FIGS. 2A-2D, the second doped semiconductor layer 210 is between the first set of contacts 120 and the first doped semiconductor layer 110, and an electrically insulating layer 240 separates the second doped semiconductor layer 210 from the first set of contacts 120. A metal layer between the insulating layer 240 and second doped semiconductor layer 210 acts as the one or more contacts 220, and can also act as an optical reflector for light emitted by the device 100. The vias 130 connect contacts 120 to the first doped semiconductor layer 110 through the insulating layer 240, the contact 220, and the second doped semiconductor layer 210, and the vias 130 are electrically insulated from the one or more contacts 220 and from the second doped semiconductor layer 210. In some examples that are thus arranged, the first doped semiconductor layer 110 can be an n-doped layer and the second doped semiconductor layer 210 can be a p-doped layer. The insulating layer 240 can include any one or more suitable materials; in some examples the insulating layer 240 includes doped or undoped silica. In some examples (e.g., as in FIG. 2A), the vias 130 are connected directly to the first doped semiconductor layer 110 (i.e., arranged as n-vias if the layer 110 is an n-doped layer). In some examples, (e.g., as in FIGS. 2B-2D), an electrode layer 150 is formed on and in direct contact with the first doped semiconductor layer 110. The electrode 150 is substantially transparent for light emitted by the device 100, and the vias 130 connect the first doped semiconductor layer 110 to the contacts 120 by connecting the electrode 150 to the contacts 120. The electrode layer 150 can include any one or more suitable materials; in some examples indium tin oxide (ITO) or indium zinc oxide (IZO) can be employed. In some examples (e.g., as in FIG. 2B), the electrode 150 can be a single contiguous layer spanning most or nearly all of the device 100.

Figure 2A:
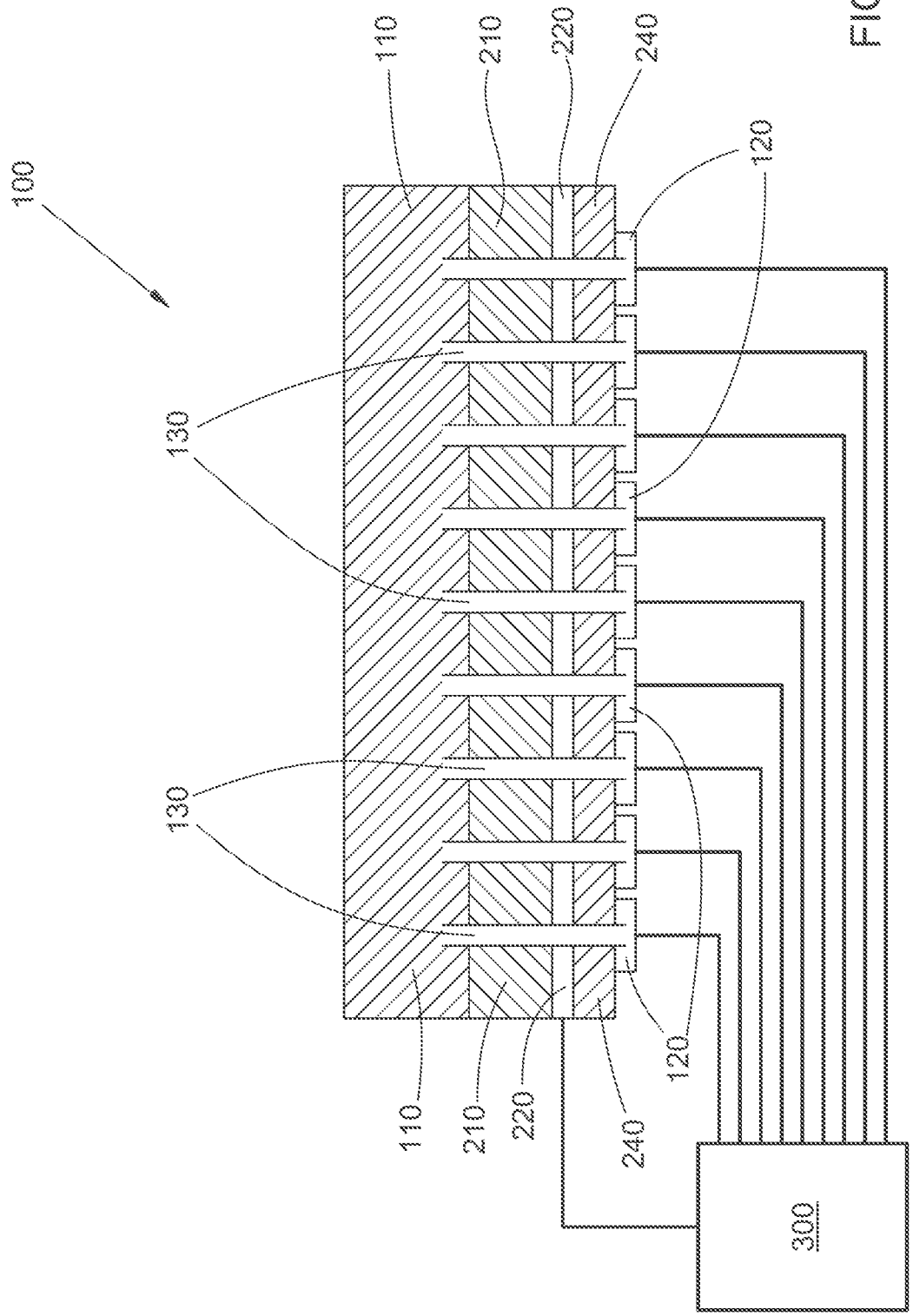
Figure 2B:
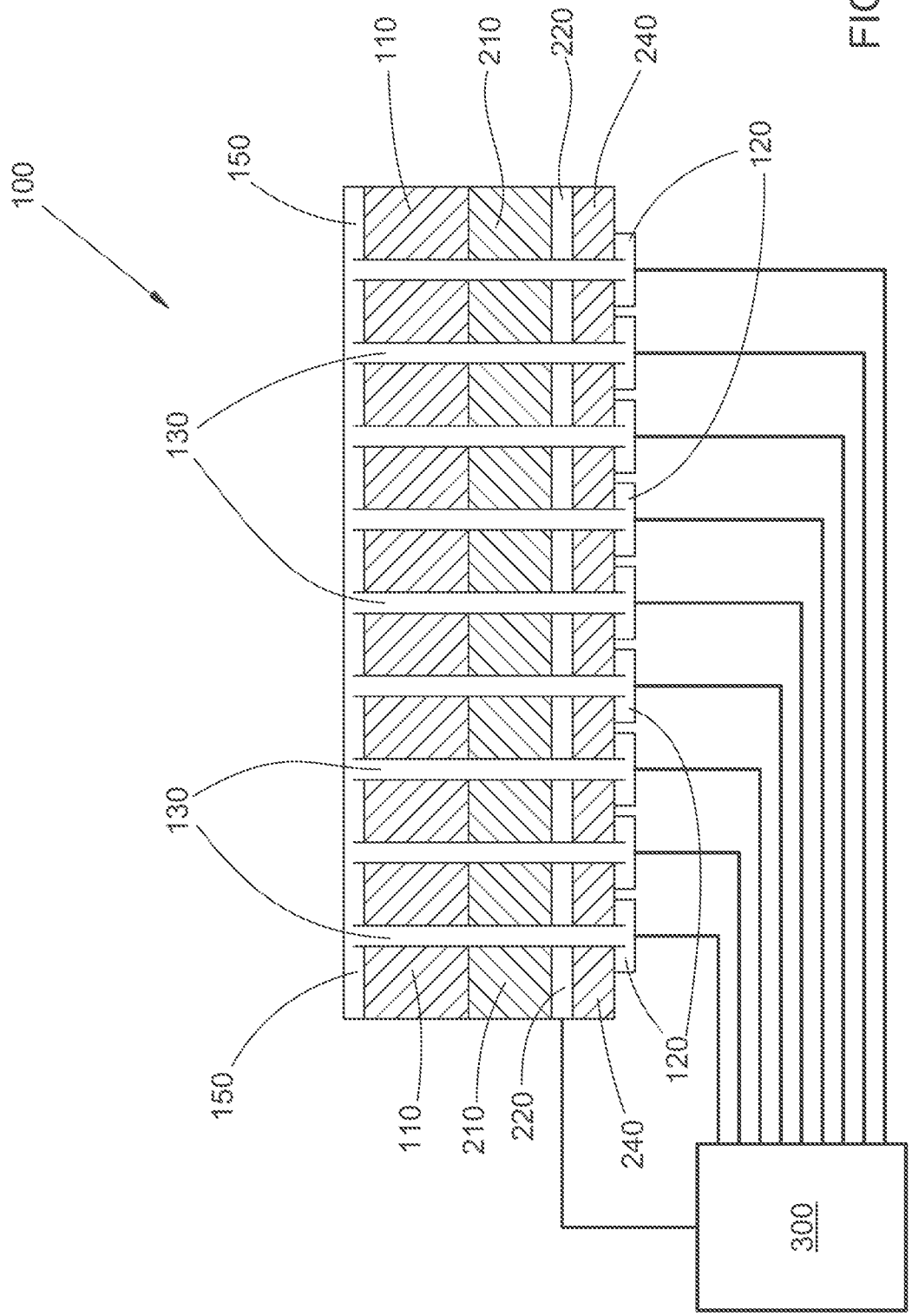
Figure 2D:
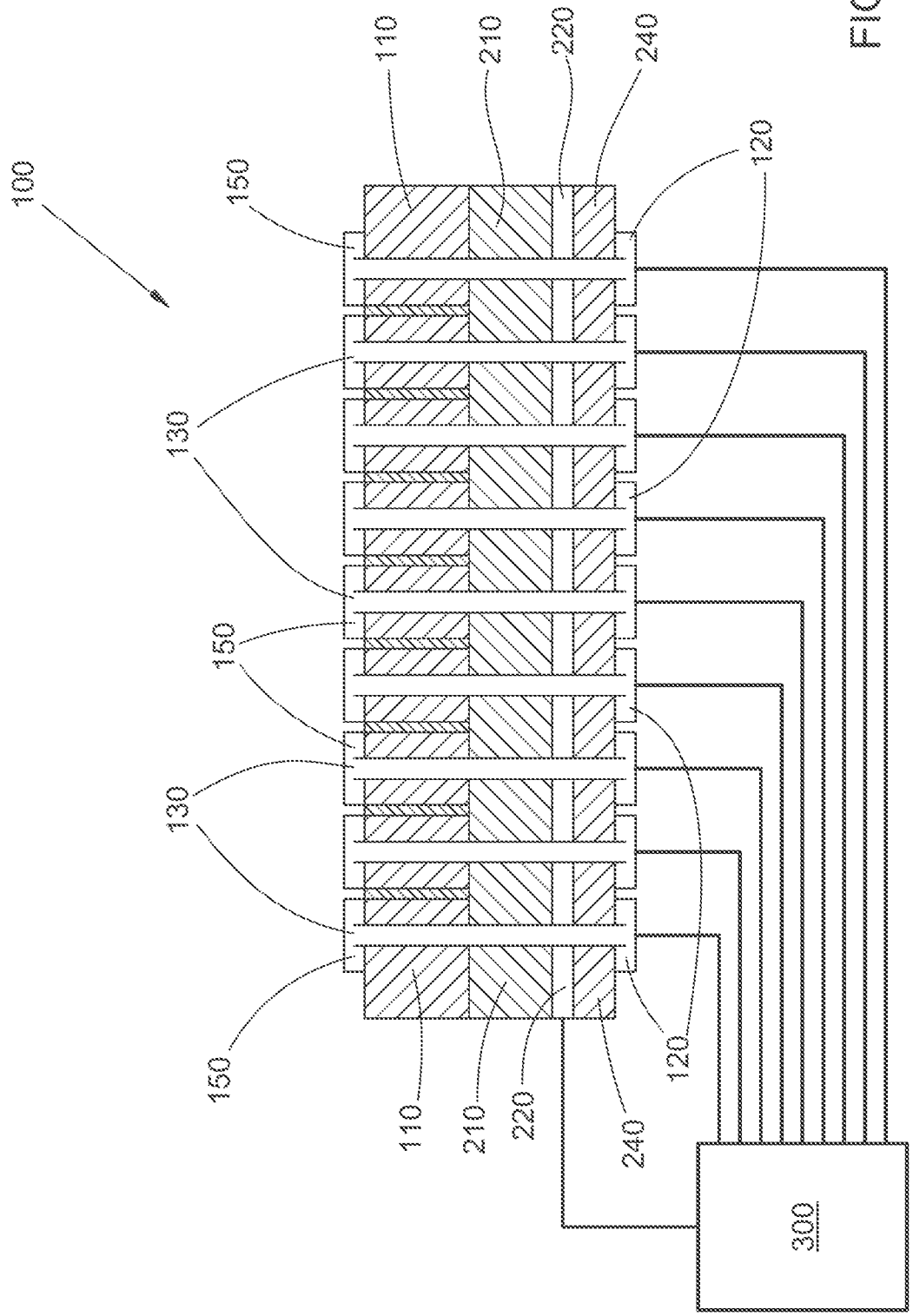

In other examples (e.g., as in FIGS. 2C and 2D), it can be desirable to arrange the electrode layer 150 as multiple discrete areal segments separated by electrically insulating material or empty space, thereby substantially preventing transverse electrical conduction between adjacent areal segments of the electrode layer 150. In some examples that include such an arrangement, each areal segment of the electrode layer 150 can be connected to at most one corresponding contact 120 by one or more corresponding vias 130; in other examples that include such an arrangement, each areal segment of the electrode layer 150 can be connected to multiple different contacts 120 by corresponding vias 130. As noted above, the segmentation of the electrode layer 150 can enhance the spatial resolution of the carrier recombination spatial distribution provided by the vias 130, by somewhat limiting the transverse movement of charge carriers to or from any given via 130 to the area occupied by the corresponding areal segment of the electrode layer 150. In the examples of FIGS. 2A-2C, the first doped semiconductor 110 can be a single contiguous layer spanning most or nearly all of the device 100 (except for, e.g., other vias that pass through it, if present). Further enhancement of spatial resolution can be achieved in some examples (e.g., as in FIG. 2D), by division of the first doped semiconductor layer 110 into multiple discrete areal segments separated by electrically insulating material. As noted above, in such an arrangement movement of charge carriers between a given contact 120 and the junction is confined transversely by insulating material separating the corresponding areal segments of the electrode layer 150 and the first doped semiconductor layer 110 from adjacent segments. If suitable or desirable, in some examples the second doped semiconductor layer 210 can be similarly divided into discrete areal segments (not shown).

In some instances the arrangements of FIGS. 1A-1D may be advantageous relative to the arrangement of FIGS. 2A-2D, for a number of reasons. Because the arrangements of FIGS. 2A-2D require vias 130 that pass through the junction between the doped semiconductor layers 110/210 and preclude carrier recombination and light emission from the areas occupied by the vias 130, those arrangements necessarily include dark spots in the emission intensity distribution corresponding to the locations of the vias 130. Because vias 130 are not required to cross the junction in the arrangements of FIGS. 1A-1D, such dark spots can be reduced or eliminated. In addition, vias 130 formed in the arrangements of FIGS. 2A-2D must pass entirely through one of the doped semiconductor layers, through the junction (and any active layers or quantum wells present there), and into the other doped semiconductor layer. Those vias 130 also must be electrically insulated from those layers. In contrast, the vias 130 in the arrangements of FIGS. 1A-1D typically pass through fewer layers (in some instances through only a single layer of insulating material) and do not pass through the junction. As a result, the fabrication process for forming the vias 130 for the arrangement of FIGS. 2A-2D is necessarily more complex and includes additional deposition, mask, and etch steps, compared to a fabrication process for forming the vias 130 for the arrangements of FIGS. 1A-1D. In particular, formation of vias 130 that pass through one or more active layers or quantum wells at the junction between the doped semiconductor layers 110/210 can be particularly problematic.

In addition to the vias 130 connected to the contacts 120, in some examples the first set of contacts 120 can include one or more edge contacts positioned about the periphery of the device 100 (not shown). In some examples, the second set of contacts 220 can include one or more edge contacts positioned about the periphery of the device 100 (e.g., as in FIGS. 2A-2D), or can include one or more areal contacts 220 on the same side of the device 100 as the contacts 120 (not shown) or on the opposite side of the device 100 (e.g., as in FIGS. 1A-1D). The arrangements shown in FIGS. 1A-1D and 2A-2D are chosen as a matter of convenience only, because they result in less cluttered drawings; similarly, additional conductive or insulating layers that might be employed for establishing connections among the doped semiconductor layers 110/210, the contacts 120/220, or the drive circuit 300 are omitted from the drawings for clarity. In some examples, the device 100 can include a second array of multiple electrically conductive vias (not shown) arranged across the device 100. In such examples the vias of that second array can connect contacts 220 to the second doped semiconductor layer 210, and each such via provides a corresponding discrete, localized, circumscribed electrical connection between the second doped semiconductor layer 210 and a corresponding contact 220. In some examples that include a second array of vias, the second set of contacts 220 can include multiple independent electrically conductive contacts 220, and each via of the second array can connect at most one corresponding contact 220 of the second set to the second doped semiconductor layer; in other words, in those examples the contacts 220 and the vias of the second array can be arranged as described above for the contacts 120 and the vias 130 of the first array.

The various arrangements described above for the multiple independent contacts 120 and the multiple vias 130 can be employed to conduct differing corresponding via currents through each of the vias 130, resulting in position dependent carrier recombination density and corresponding position dependent light emission intensity produced by the device 100. To achieve that result, an inventive light emitting device 100 can include a drive circuit 300 connected to the first and second sets of contacts 120/220. The drive circuit can be arranged in any suitable way and can include any suitable set of components or circuit elements, including but not limited to analog components, digital components, active components, passive components, ASICs, computer components (e.g., processors, memory, or storage media), analog-to-digital or digital-to-analog converters, and so forth. The drive circuit 300 provides electrical drive current that flows through the device 100 and causes the device 100 to emit light. The drive circuit 300 is further structured and connected so that (i) corresponding portions of the electrical drive current flow through one or more of the vias 130 as corresponding via currents, and (ii) each via current magnitude differs from the corresponding via current magnitude of at least one other of the vias 130. In other words, the via current magnitudes can differ among the different via 130, and the spatial distribution of those via current magnitudes determines the local carrier recombination density, which in turn determines the local light emission intensity.

In some examples the contacts 120 and the vias 130 can be connected one-to-one, enabling individual control over the via current magnitude flowing through each via 130, independent of via current magnitudes flowing through the other vias 130 of the array. Such fine-grained control may not be necessary in every instance, so in some examples some or all of the contacts 120 can each be connected to multiple corresponding vias 130, and some or all of the vias 130 can be connected to a corresponding contact 120 along with one or more other vias 130. In such an arrangement, current flowing through a contact 120 would be substantially equally divided among the vias 130 connected to it (assuming substantially identical vias 130), so that substantially equal via current magnitudes flow through each of those multiple vias 130 that are connected to the same contact 120. In one specific such example, the vias 130 can be arranged in multiple rows that each includes multiple vias 130. A "row" is defined as a subset of the vias 130 that are all at the same distance, or within a relative narrow range of distances, from one edge of the device 100. Examples of such rows can include, e.g., multiple vias 130 arranged along a single straight line or along a zigzagging line (e.g., as might arise if the row included multiple vertices of a row of hexagonal unit cells). Whatever its detailed arrangement, each row extends across the device 100 along a first transverse dimension and the multiple rows can be arranged across the device 100 along a second, orthogonal transverse dimension. Each via 130 of a given row can be connected to a single corresponding contact 120 that is different from corresponding contacts 120 connected to one or more other row of vias 130. Each row current is the sum of the via current magnitudes flowing through the corresponding vias 130 of that row. In some examples the rows and contacts 120 can be connected one-to-one; in other examples one or more of the contacts 120 can be connected to a group of multiple rows. In some examples the vias 130 can be organized into rows not by connecting contacts 120 to multiple vias 130 directly, but instead by configuring the drive circuit 300 to deliver the same via drive current magnitude to all of the vias 130 that make up a given row through their corresponding independent contacts 120.

Such a grouping of the vias 130 into rows, whether by direct connection to common contacts 120 or by operation of the drive circuit 300 to couple certain groups of independent vias 130, can be well-suited for producing a so-called sloped light emission intensity distribution that has a maximum at or relatively near a first edge of the device and decreases monotonically toward the opposite edge of the device 100 (discussed further below). To achieve such an emission intensity distribution, the drive circuit can provide a corresponding row current to each row that decreases monotonically across the device 100 along the second transverse dimension (i.e., perpendicular to the rows).

There are several ways in which differing via current magnitudes can be applied among the multiple vias 130. In many examples the via current magnitude will have minimum and maximum values that can be delivered by the drive circuit 300; in many of those examples the minimum via current magnitude can be about equal to zero. In some examples, each via 130 (or group of vias 130 connected to the same contact 120) can be either "off" (carrying the minimum via current magnitude) or "on" (carrying the maximum via current magnitude). In some other examples, each via 130 or group of connected vias 130 can also carry via current magnitudes that are between the minimum and maximum (e.g., a percentage or fraction of the maximum via current magnitude), in discrete steps in some examples or over a continuous range in other examples. The drive circuit 300 can be arranged in some examples to deliver those intermediate via current levels as DC currents to the respective vias 130; in other examples the drive circuit 300 can be arranged to apply the specified minimum and maximum via current magnitudes alternating at a frequency above the subjective flicker fusion threshold (e.g., above about 60 Hz, above about 90 Hz, above about 120 Hz, or above about 200 Hz) and with a corresponding duty cycle between zero and one that can be selected for each via 130 (or group of connected vias 130) to achieve the desired time-averaged via current magnitude.

The drive circuit can be arranged to provide one or more specified spatial distributions across the device 100 of the differing via current magnitudes provided to the corresponding vias 130 of the array. Each specified via current magnitude distribution among the vias 130 results in corresponding spatial distribution of carrier recombination and light emission intensity across the device 100. For a desired light emission intensity spatial distribution, a corresponding distribution of via current magnitudes can be specified that results, in combination with the spatial arrangement of the vias 130, in an acceptable approximation of the desired emission distribution. Whether a given approximation is "acceptable" can depend on the particular use of the light-emitting device 100; some uses can have more stringent requirements than others. Various emission distributions can be advantageously employed in automotive applications (e.g., for headlight low or high beams), or in other, non-automotive applications. A method for using an inventive light-emitting device 100 comprises operating the drive circuit 300 to provide a specified spatial distribution of via current magnitudes to the vias 130 and thereby cause the device 100 to emit light according to a corresponding emission intensity distribution.

Figure 3B:
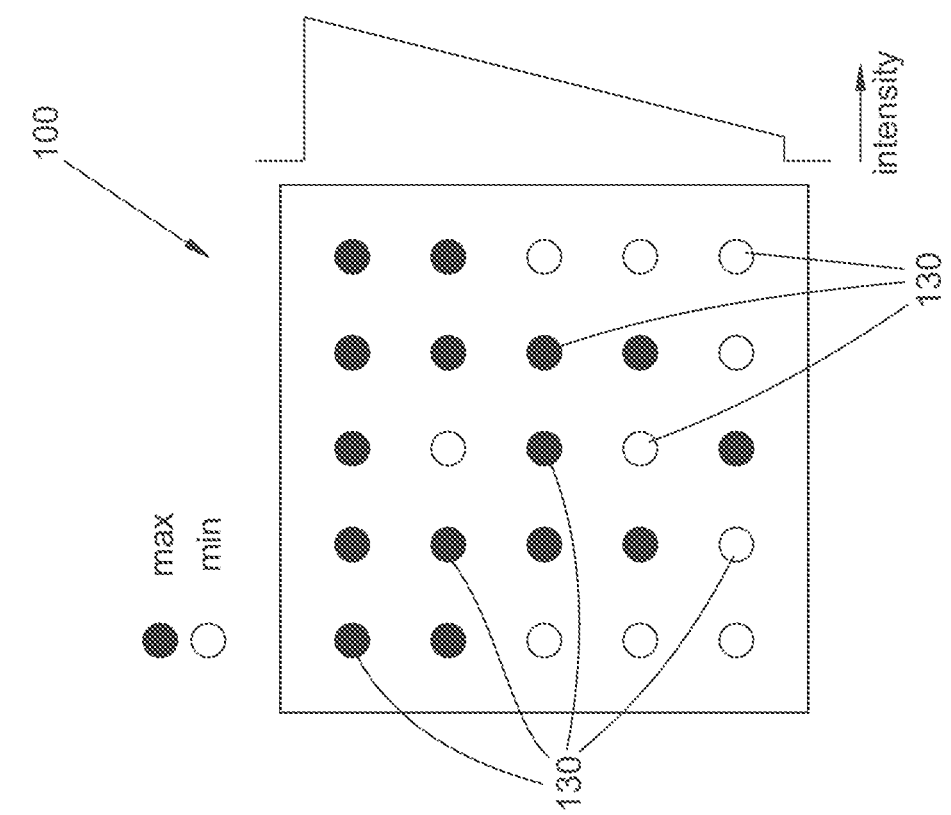
FIG. 3A and FIG. 3B are examples of via current magnitude distributions for producing a sloped emission intensity distribution using any of the examples of FIGS. 1A-1D or 2A-2D.
Figure 3A:
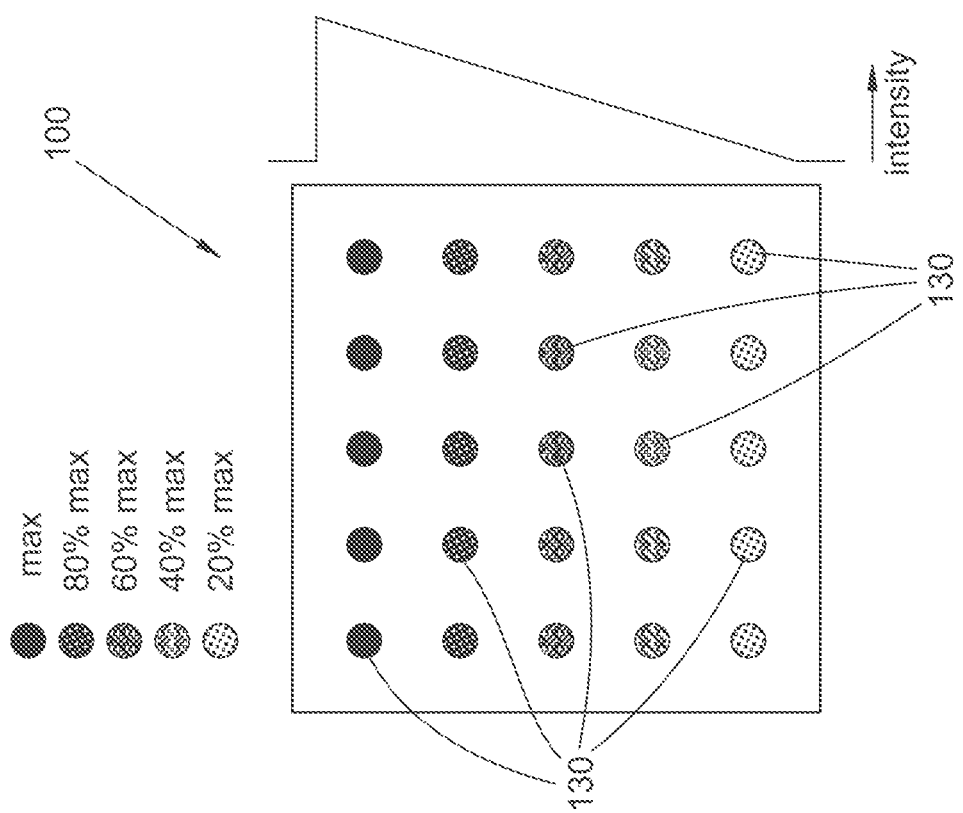

One example of a desired light emission intensity distribution is the sloped distribution mentioned above, wherein the emission intensity is maximum along or near a first edge of the device and decreases in one dimension toward the opposite edge of the device. Such an emission intensity distribution can be advantageously employed in, e.g., low-beam automotive headlights. A sloped emission intensity distribution can be approximated by configuring the drive circuit 300 to provide via current magnitudes distributed among the vias 130 that result in the desired carrier recombination distribution, which can be achieved in a number of ways using a regular array of identical vias 130. In some examples the via current magnitude for each via 130 can monotonically decrease with increasing distance from the first edge, either continuously or in steps, using either variable DC currents or variable duty cycle between fixed minimum and maximum via current magnitudes. In one specific example, for a device 100 with a 5×5 array of vias 130, the maximum via current magnitude is applied to each via 130 of the first row, 80% of the maximum is applied to the second row, 60% of the maximum is applied to the third row, 40% of the maximum is applied to the fourth row, and 20% of the maximum is applied to the fifth row (illustrated schematically in FIG. 3A; other array sizes and other position dependencies can be employed). In some examples each via 130 receives either the minimum or maximum via current magnitude but no intermediate value, and the number of vias 130 receiving the maximum via current magnitude decreases by row across the device 100. In another specific 5×5 example, the maximum via current magnitude is applied to five vias of the first row, four vias of the second row, three vias of the third row, two vias of the fourth row, and one via of the fifth row, while all other vias 130 receive the minimum via current magnitude (illustrated schematically in FIG. 3B; other array sizes and other position dependencies can be employed). Note that between the first edge of the device 100 and those vias 130 closest to that first edge, the light emission intensity typically would increase from the zero just beyond the edge to a maximum intensity near the first row of vias of the device 100. That initial increase typically has no practical effect, and devices exhibiting the initial increase can nevertheless be considered to have a monotonically decreasing light emission intensity profile.

Figure 4B:
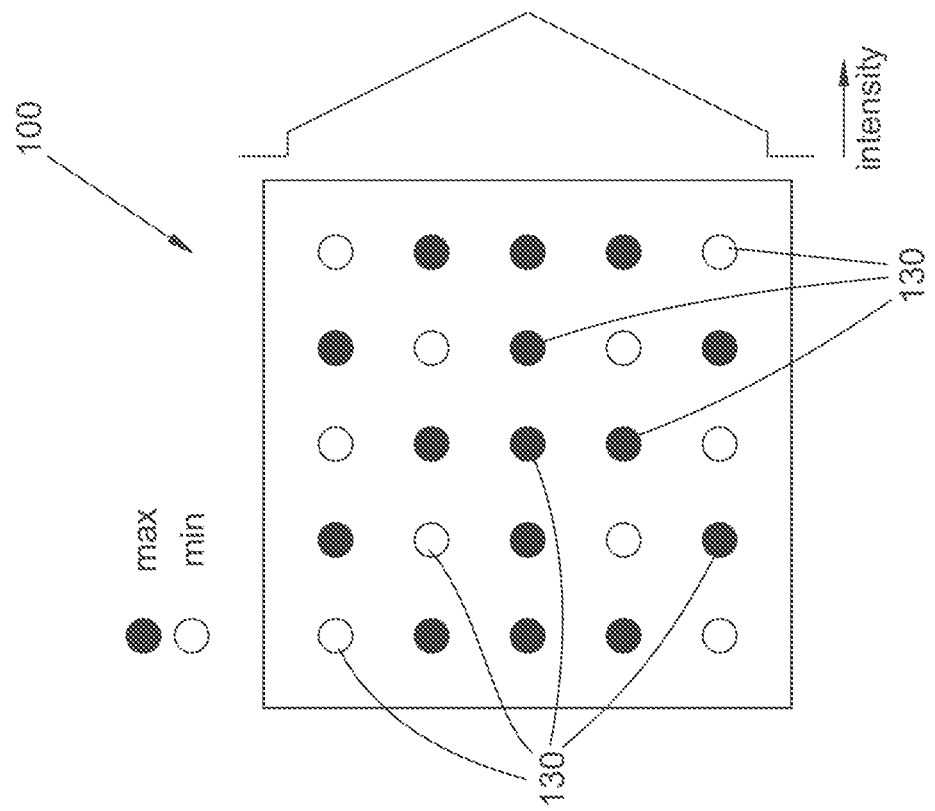
FIG. 4A and FIG. 4B are examples of via current magnitude distributions for producing a 1D-peaked emission intensity distribution using any of the examples of FIGS. 1A-1D or 2A-2D.
Figure 4A:
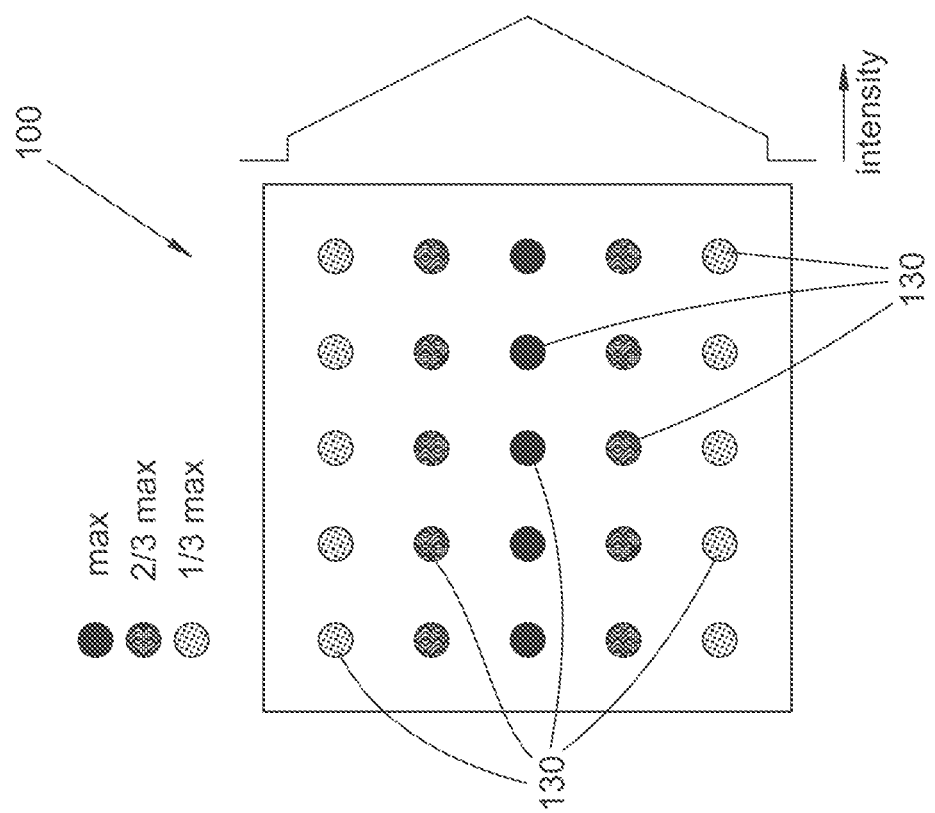

Another example of a desired light emission intensity distribution is a so-called 1D-peaked distribution, wherein the emission intensity has a maximum along a line across a central region of the device 100 and decreases in both directions along one transverse dimension toward opposite edges of the device 100. A 1D-peaked emission intensity distribution can be approximated by configuring the drive circuit 300 to provide via current magnitudes distributed among the vias 130 that result in the desired carrier recombination distribution, which can be achieved in a number of ways using a regular array of identical vias 130. In some examples the via current magnitude for each via 130 can decrease from the center toward the opposite edges, either continuously or in steps, using either variable DC currents or variable duty cycle between fixed minimum and maximum via current magnitudes. In a specific 5×5 example, the maximum via current magnitude is applied to each via 130 of the third row, ⅔ of the maximum is applied to the second and fourth rows, and ⅓ of the maximum is applied to the first and fifth rows (illustrated schematically in FIG. 4A; other array sizes and other position dependencies can be employed). In some examples each via 130 receives either the minimum or maximum via current magnitude but no intermediate value, and the number of vias 130 receiving the maximum via current magnitude decreases by row across the device 100 from the central row. In a specific 5×5 example, the maximum via current magnitude is applied to five vias of the third row, three vias of the second and fourth rows, and two vias of the first and fifth rows, while all other vias 130 receive the minimum via current magnitude (illustrated schematically in FIG. 4B; other array sizes and other position dependencies can be employed).

Figure 5B:
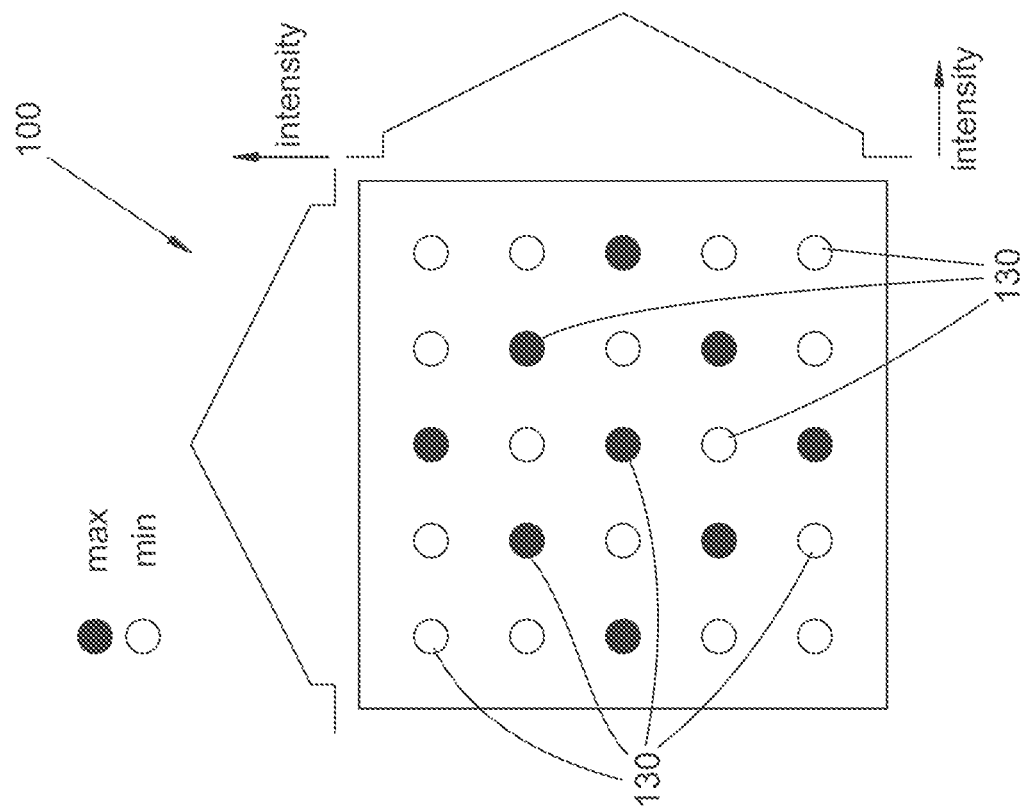
FIG. 5A and FIG. 5B are examples of via current magnitude distributions for producing a 2D-peaked emission intensity distribution using any of the examples of FIGS. 1A-1D or 2A-2D.
Figure 5A:
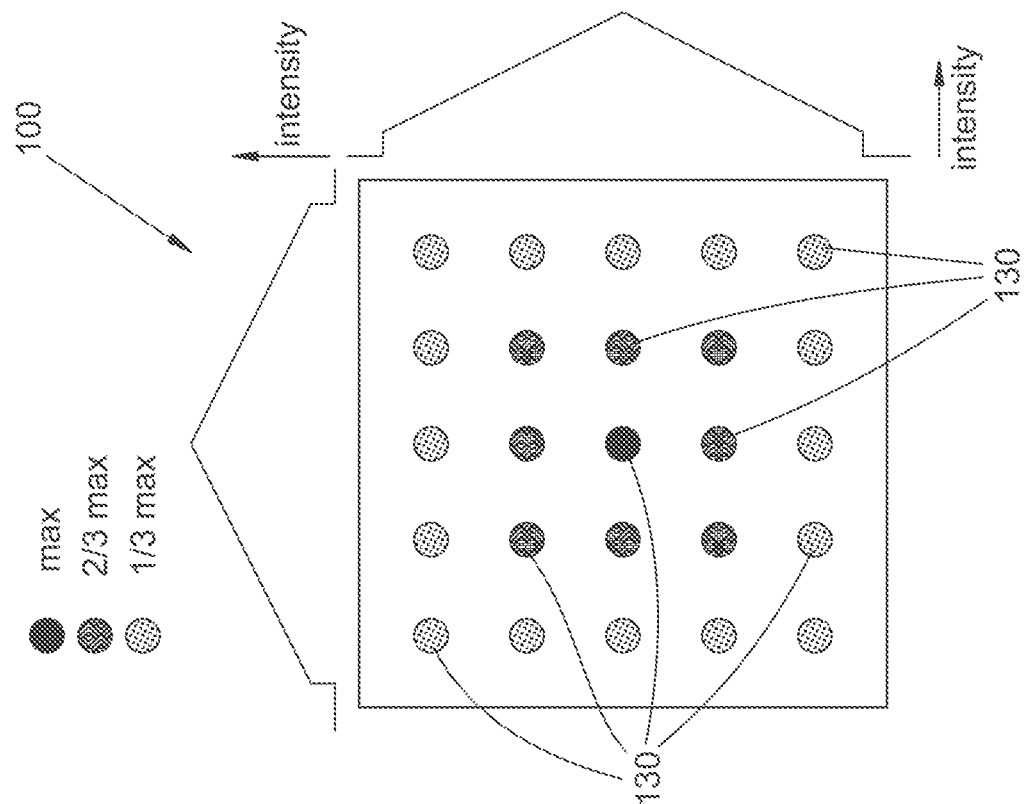

Another example of a desired light emission intensity distribution is a so-called 2D-peaked distribution, wherein the emission intensity has a maximum in a central region of the device 100 and decreases in both directions along both transverse dimensions toward the edges of the device 100. Such an emission intensity distribution can be advantageously employed in, e.g., high-beam automotive headlights. A 2D-peaked slope emission intensity distribution can be approximated by configuring the drive circuit 300 to provide via current magnitudes distributed among the vias 130 that result in the desired carrier recombination distribution, which can be achieved in a number of ways using a regular array of identical vias 130. In some examples the via current magnitude for each via 130 can decrease from the center toward all edges, either continuously or in steps, using either variable DC currents or variable duty cycle between fixed minimum and maximum via current magnitudes. In a specific 5×5 example, the maximum via current magnitude is applied to the center via 130 of the third row, ⅔ of the maximum is applied to the second through fourth vias 130 of the second and fourth rows and to the second and fourth vias 103 of the third row, and ⅓ of the maximum is applied to the first and fifth rows and the first and fifth vias of the second through fourth rows (illustrated schematically in FIG. 5A; other array sizes and other position dependencies can be employed). In some examples each via 130 receives either the minimum or maximum via current magnitude but no intermediate value, and the number of vias 130 receiving the maximum via current magnitude decreases distance across the device 100 from the central via 130. In a specific 5×5 example, the maximum via current magnitude is applied to the center via 130 of the third row, the second and fourth vias 130 of the second and fourth rows, the first and fifth vias 130 of the third row, and the third via 130 of the first and fifth rows, while all other vias 130 receive the minimum via current magnitude (illustrated schematically in FIG. 5B; other array sizes and other position dependencies can be employed).

It should be noted that all of the different via current distributions described and shown herein, and myriad others, can all be achieved using a single light-emitting device 100, or by a set of identically arranged light-emitting devices 100. Those different via current distributions, and the corresponding different emission distributions, result from corresponding different modes of operation of the drive circuit 300, illustrating the utility of the various arrangements of the inventive light emitting device 100, as further elaborated below.

In some examples the drive circuit 300 provides only a single specified spatial distribution across the device 100 of the corresponding magnitudes of the via currents, so that the device is arranged so as to provide only a single corresponding spatial distribution of light emission intensity. Although each device 100 produces only a single emission intensity distribution, a manufacturer can provide a variety of different light-emitting apparatus that produce a variety of corresponding different emission intensity distributions, and yet all incorporate the same light-emitting device 100. The differences in the emission intensity distributions arise from difference between configuration of the drive circuit 300 and its connections among the multiple contacts 120. For example, the six different examples described above could all be made using the same device 100 with a 5×5 array of identical vias 130, because the independence of the contacts 120 enables each the via current magnitude to be applied through a corresponding contact 120 independent of other via currents applied through other contacts 120. The differences among the respective emission intensity distributions of the preceding examples can all be implemented by differences in configuration or operation of their respective drive circuits 300.

In other examples, the drive circuit 300 can be arranged so as to enable dynamic switching among two or more different specified spatial distributions of via current magnitudes provided by the drive circuit 300. That dynamic switching in turn enables dynamic alteration the spatial distribution of light emission intensity across the device 100, which can be advantageously employed in a variety of ways. Again referring to the 5×5 device examples above, a drive circuit 300 can be configured to enable switching among any two or all three of those emission intensity distributions, simply by suitably rerouting or altering via currents among the vias 130 of the device 100. In automotive headlights, for example, instead of having two separate sets of conventional devices 10 (one sloped and one 2D-peaked) and switching between them for low and high beams, a single set of inventive devices 100 can be employed and the drive circuit 300 used to alter the emission distribution between the sloped distribution (for low beams) and the 2D-peaked distribution (for high beams). Such dynamic control of the emission intensity distribution could also be employed, e.g., for lateral or vertical headlight beam steering as a car makes a turn or crests a hill, or for any number of other automotive and non-automotive purposes. An inventive method comprises: (A) selecting a first specified spatial distribution of via current magnitudes; (B) operating the drive circuit 300 to provide the first specified spatial distribution of via current magnitudes to the vias 130 and thereby cause the device 100 to emit light according to a corresponding first emission intensity distribution; (C) selecting a second specified spatial distribution of via current magnitudes that differs from the first specified spatial distribution of via current magnitudes; and (D) operating the drive circuit 300 to provide the second specified spatial distribution of via current magnitudes to the vias 130 and thereby cause the device 100 to emit light according to a corresponding second emission intensity distribution that differs from the first emission intensity distribution.

A method for making an inventive light-emitting device 100 comprises: (A) using any one or more suitable spatially selective material processing techniques, forming the first and second doped semiconductor layers 110/210 with the junction between them; (B) using any one or more suitable spatially selective material processing techniques, forming the array of vias 130 connected to the first doped semiconductor layer 110; (C) using any one or more suitable spatially selective material processing techniques, forming the first set of contacts 120 connected to the first doped semiconductor layer 110 by the array of vias 130; and (D) using any one or more suitable spatially selective material processing techniques, forming the second set of contacts 220 connected to the second doped semiconductor layer 210. Another method for making an inventive light-emitting device comprising connecting the drive circuit 300 to the first and second sets of contacts 120/220 of the light-emitting device 100, and arranging the drive circuit 300 to provide a specified spatial distribution of via current magnitudes to the vias 130.

Figure 6:
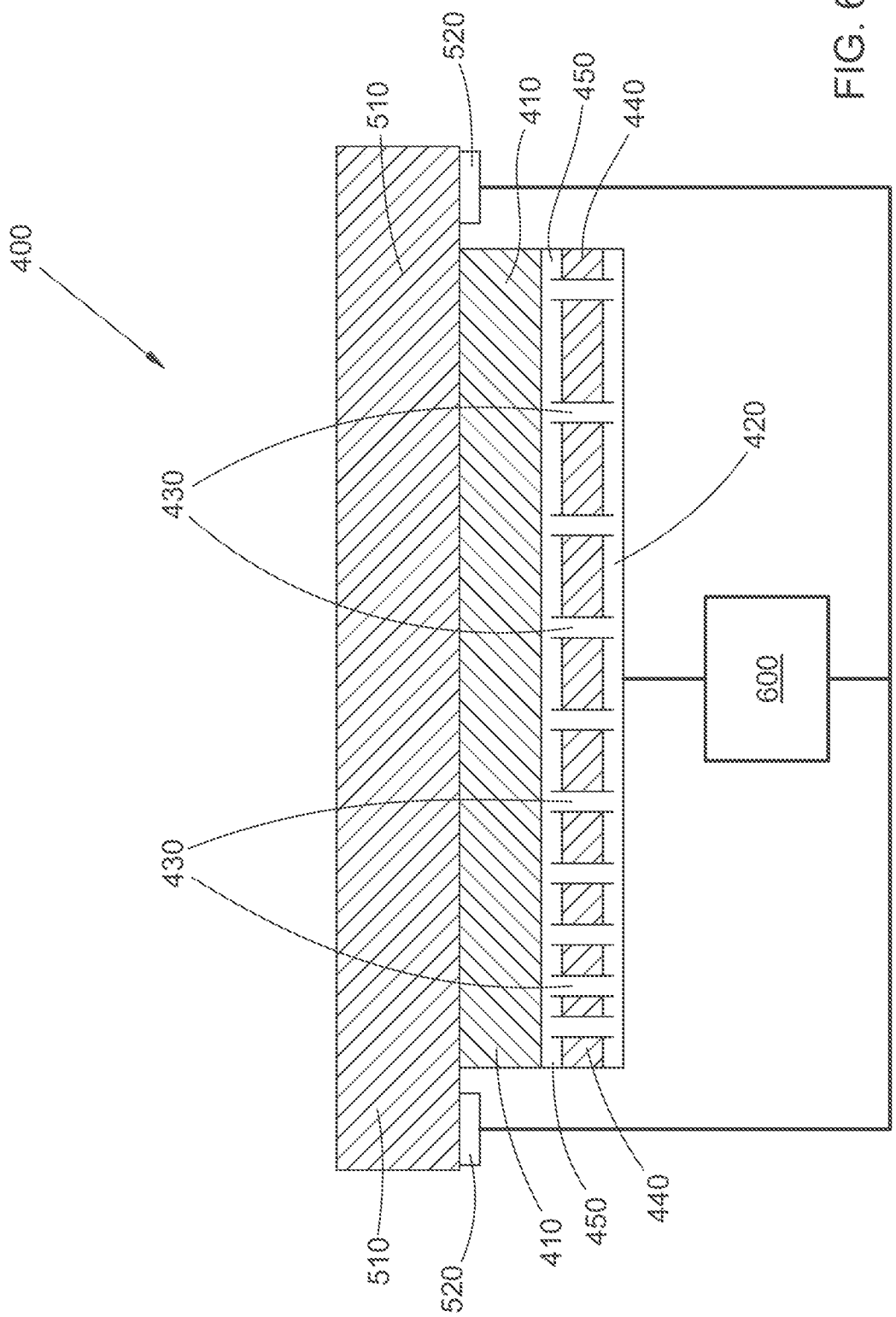
FIG. 6 is a schematic side cross-sectional view of an example arrangement of a second inventive light-emitting device.

Another inventive light-emitting device 400 is illustrated schematically in FIG. 6, and includes p-doped and n-doped semiconductor layers 410 and 510, respectively, a first set of electrical conductive contacts 420, a second set of electrical conductive contacts 520, and an array of electrically conductive vias 430. The p-doped and n-doped semiconductor layers 410/510 are arranged for emitting light resulting from carrier recombination at a junction between them. The junction can be of any type or arrangement suitable for generating light in response to current passing through the device 400 under forward-biased conditions. In some examples the junction can include one or more active semiconductor layers or one or more quantum wells. Any one or more suitable semiconductor materials can be employed for the p-doped semiconductor layer 410, the n-doped semiconductor layer 510, and the active layers or quantum well(s) (if present). In many examples one or more doped III-V semiconductor materials or alloys thereof are employed to form the p- and n-doped semiconductor layers 410/520. In many examples that include one or more active layers or quantum wells, those can include one or more doped or undoped III-V semiconductor materials or alloys thereof.

Figure 7B:
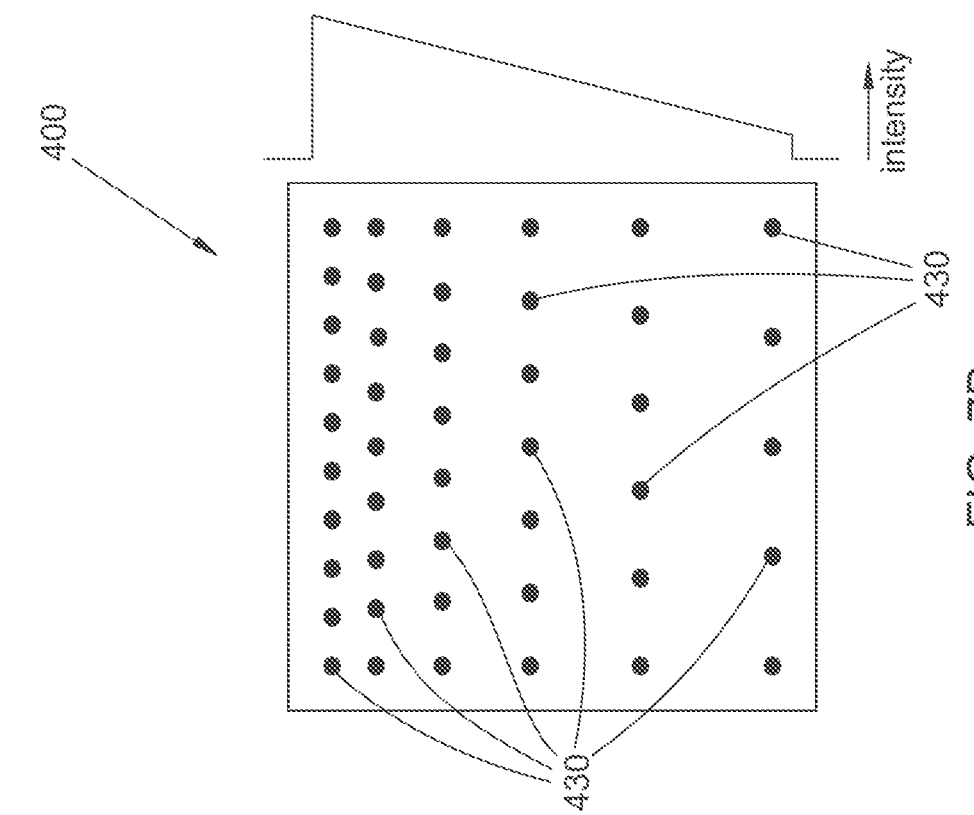
FIG. 7B is an example of via number density distribution for producing a sloped emission intensity distribution using the example of FIG. 6.
Figure 7A:
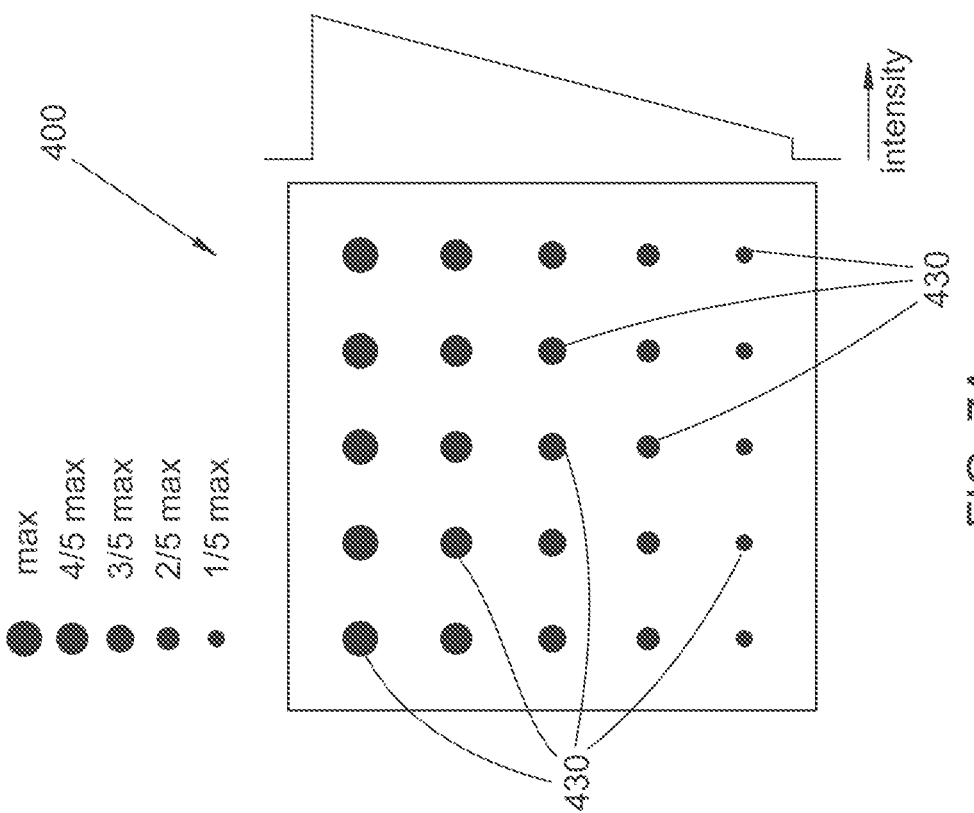
FIG. 7A is an example of a via size distribution for producing a sloped emission intensity distribution using the example of FIG. 6.

The first set of contacts 420 includes one or more electrically conductive contacts 420 each electrically connected to the p-doped semiconductor layer 410; if multiple contacts 420 are present they are directly coupled or operated as if they were, and so shall be referred to in the singular. The second set of contacts 520 includes one or more electrically conductive contacts 520 each electrically connected to the n-doped semiconductor layer 510; if multiple contacts 520 are present they are directly coupled or operated as if they were, and so shall be referred to in the singular. The array of vias 430 includes multiple electrically conductive vias 430 arranged across the device 400. The vias 430 of the array connect the contact 420 to the p-doped semiconductor layer 410, with each via 430 providing a corresponding discrete, localized, circumscribed electrical connection between the p-doped semiconductor layer 410 and the contact 420. The contacts 420/520 and the vias 430 can include any one or more suitable electrically conductive materials; metals typically can be employed. The array of vias 430 is arranged across the device 400 so that one or both of via local number density (equivalently, via spacing) or via transverse area varies according to position across the device 400 (e.g., variation of via transverse area in FIG. 7A, and variation of via local number density in FIG. 7B). That variation in turn results in a corresponding spatial distribution of light emission intensity that varies across the device 400 according to the arrangement of the array of vias 430. The device 400 can further include an electrically insulating layer 440 between the p-doped semiconductor layer 410 and the contact 420, wherein the vias 430 connect the contact 420 to the p-doped semiconductor layer 410 through the insulating layer 440. The insulating layer 440 can include any one or more suitable materials; doped or undoped silica is often employed.

Any suitable arrangement can be employed for variation of the sizes or spacings of the vias 430. In one example, substantially identical vias 430 can be employed arranged with smaller spacings between them in area where higher emission intensity is desired, and with larger spacings between them in areas where lower emission intensity is desired (e.g., as in FIG. 7B). In another examples, the vias 430 can be positioned according to a regular grid pattern, with vias having larger diameters positioned in regions where higher emission intensity is desired and vias having smaller diameters positioned in regions where lower emission intensity is desired (e.g., as in FIG. 7A; fractions refer to a fraction of maximum via area). Suitable combinations of varying sizes and spacings can be advantageously employed. Any suitable emission intensity distribution can be selected including any of those described above (e.g., sloped, 1D-peaked, or 2D-peaked; sloped shown in FIGS. 7A and 7B).

In some examples the contact 420 can include one or more metals or metal alloys, and the contact 420 and the insulating layer 440 can be arranged so as to act as a composite optical reflector for light emitted by the device 400. In some examples the device 400 includes an electrode layer 450 between the p-doped semiconductor layer 410 and the insulating layer 440; the electrode layer 450 is in direct contact with the p-doped semiconductor layer 410. The electrode layer 450 is substantially transparent for light emitted by the device 400, and the vias 430 connect the p-doped semiconductor layer 410 to the contact 420 by connecting the electrode layer 450 to the contact 420 (i.e., vias 430 arranged as e-vias in this example). Any suitable electrode material can be employed; in some examples the electrode material includes indium tin oxide (ITO) or indium zinc oxide (IZO).

In addition to the vias 430 connected to the contact 420, in some examples the contact 420 can include one or more edge contacts positioned about the periphery of the device 400 (not shown). In some examples, the contact 520 can include one or more edge contacts 520 positioned about the periphery of the device 400 (not shown), or can include one or more areal contacts 520 on the same side of the device 400 as the contact 420 (e.g., as in FIG. 6) or on the opposite side of the device 400 (not shown). Additional conductive or insulating layers that might be employed for establishing connections among the doped semiconductor layers 410/510, the contacts 420/520, or the drive circuit 600 are omitted from the drawings for clarity. In some examples, the device 400 can include a second array of multiple electrically conductive vias (not shown) arranged across the device 400. In such examples the vias of that second array can connect the contact 520 to the second doped semiconductor layer 510, and each such via provides a corresponding discrete, localized, circumscribed electrical connections between the n-doped semiconductor layer 510 and the contact 520. In some such examples, the sizes or spacings of the vias of the second array can vary across the device 400 in a manner similar to such variations of the vias 430 of the first array described above.

In addition to the preceding, the following example embodiments fall within the scope of the present disclosure or appended claims:

Example 1. A semiconductor light-emitting device (LED) comprising: (a) first and second doped semiconductor layers that are arranged for emitting light resulting from carrier recombination at a junction between the first and second doped semiconductor layers; (b) a first set of multiple independent electrically conductive contacts each electrically connected to the first doped semiconductor layer; (c) a second set of one or more electrically conductive contacts each electrically connected to the second doped semiconductor layer; and (d) an array of multiple electrically conductive vias arranged across the device, the vias of the array connecting contacts of the first set to the first doped semiconductor layer, each via connecting at most one corresponding contact of the first set to the first doped semiconductor layer, each via being arranged so as to provide a corresponding discrete, localized, circumscribed electrical connection between the first doped semiconductor layer and the corresponding contact of the first set.

Example 2. The device of Example 1 wherein the contacts of the first and second sets are metal contacts and the vias of the array are metal vias.

Example 3. The device of any one of Examples 1 or 2 wherein the array of vias is arranged across the device as a substantially regular grid of substantially identical vias.

Example 4. The device of any one of Examples 1 or 2 wherein the array of vias is arranged across the device so that one or both of via local number density or via transverse area varies according to position across the device.

Example 5. The device of any one of Examples 1 through 4 wherein each contact of the first set is connected to at most one corresponding via of the array.

Example 6. The device of any one of Examples 1 through 4 wherein one or more contacts of the first set are each connected to multiple corresponding vias of the array.

Example 7. The device of any one of Examples 1 through 6 wherein (i) the first doped semiconductor layer is between the first set of contacts and the second doped semiconductor layer, (ii) the device further comprises an electrically insulating layer between the first doped semiconductor layer and the first set of contacts, and (iii) the vias connect contacts of the first set to the first doped semiconductor layer through the insulating layer.

Example 8. The device of Example 7 wherein the first doped semiconductor layer is a p-doped layer and the second doped semiconductor layer is an n-doped layer.

Example 9. The device of any one of Examples 7 or 8 wherein the contacts of the first set are metal contacts, and the first set of contacts and the insulating layer are arranged so as to act as a composite optical reflector for light emitted by the device.

Example 10. The device of any one of Examples 7 through 9 further comprising an electrode layer between the first doped semiconductor layer and the insulating layer and in contact with the first doped semiconductor layer, wherein the electrode layer is substantially transparent for light emitted by the device, and the vias of the array connect the first doped semiconductor layer to contacts of the first set by connecting the electrode layer to contacts of the first set.

Example 11. The device of Example 10 wherein (i) the electrode layer is arranged as multiple discrete areal segments separated by electrically insulating material so that transverse electrical conduction between adjacent areal segments is substantially prevented, and (ii) each areal segment of the electrode layer is connected to at most one corresponding contact of the first set.

Example 12. The device of any one of Examples 10 or 11 wherein the electrode layer includes indium tin oxide or indium zinc oxide.

Example 13. The device of any one of Examples 1 through 6 wherein (i) the second doped semiconductor layer is between the first set of contacts and the first doped semiconductor layer, (ii) the device further comprises an electrically insulating layer between the second doped semiconductor layer and the first set of contacts, (iii) the vias connect contacts of the first set to the first doped semiconductor layer through the insulating layer and the second doped semiconductor layer, and (iv) the vias are electrically insulated from the second doped semiconductor layer.

Example 14. The device of Example 13 wherein the first doped semiconductor layer is an n-doped layer and the second doped semiconductor layer is a p-doped layer.

Example 15. The device of any one of Examples 13 or 14 further comprising an electrode layer positioned on and in contact with the first doped semiconductor layer, wherein the electrode layer is substantially transparent for light emitted by the device, and the vias of the array connect the first doped semiconductor layer to contacts of the first set by connecting the electrode layer to contacts of the first set.

Example 16. The device of Example 15 wherein (i) the electrode layer is arranged as multiple discrete areal segments separated by electrically insulating material so that transverse electrical conduction between adjacent areal segments is substantially prevented, and (ii) each areal segment of the electrode layer is connected to at most one corresponding contact of the first set.

Example 17. The device of any one of Examples 15 or 16 wherein the electrode layer includes indium tin oxide or indium zinc oxide.

Example 18. The device of any one of Examples 7 through 17 wherein the insulating layer includes doped or undoped silica.

Example 19. The device of any one of Examples 1 through 18 wherein the first doped semiconductor layer includes one or more doped III-V semiconductor materials or alloys thereof, and the second doped semiconductor layer includes one or more III-V semiconductor materials or alloys thereof.

Example 20. The device of any one of Examples 1 through 19 wherein the first doped semiconductor layer is arranged as a contiguous layer substantially spanning the device, and the second doped semiconductor layer is arranged as a contiguous layer substantially spanning the device.

Example 21. The device of any one of Examples 1 through 19 wherein (i) the first doped semiconductor layer is arranged as multiple discrete areal segments separated by electrically insulating material so that transverse electrical conduction between adjacent areal segments is substantially prevented, and (ii) each areal segment of the first doped semiconductor layer is connected to at most one corresponding contact of the first set.

Example 22. The device of Example 21 wherein the second doped semiconductor layer is arranged as multiple discrete areal segments separated by electrically insulating material so that transverse electrical conduction between adjacent areal segments is substantially prevented.

Example 23. The device of any one of Examples 1 through 22 further comprising one or more active semiconductor layers at the junction between the first and second doped semiconductor layers.

Example 24. The device of any one of Examples 1 through 23 further comprising one or more quantum wells at the junction between the first and second doped semiconductor layers.

Example 25. The device of any one of Examples 1 through 24 wherein the first set of contacts includes one or more edge contacts.

Example 26. The device of any one of Examples 1 through 25 wherein the second set of contacts includes one or more edge contacts or areal contacts.

Example 27. The device of any one of Examples 1 through 26 further comprising a second array of multiple electrically conductive vias arranged across the device, the vias of the second array connecting contacts of the second set to the second doped semiconductor layer, each via of the second set being arranged so as to provide a corresponding discrete, localized, circumscribed electrical connection between the second doped semiconductor layer and a corresponding contact of the second set.

Example 28. The device of Example 27 wherein the second set of contacts includes multiple independent electrically conductive contacts, each via of the second array connecting at most one corresponding contact of the second set to the second doped semiconductor layer.

Example 29. The device of any one of Examples 1 through 28 further comprising a drive circuit connected to the first and second sets of contacts that is structured and connected so as to provide electrical drive current that flows through the device and causes the device to emit light, and that is further structured and connected so that (i) corresponding portions of the electrical drive current flow through one or more vias of the array as corresponding via currents, and (ii) each via current magnitude differs from the corresponding via current magnitude of at least one other of the vias of the array.

Example 30. The device of Example 29 wherein each contact of the first set is connected to at most one via of the array so as to enable the corresponding via current magnitude to flow through each via independent of via current magnitudes flowing through the other vias of the array.

Example 31. The device of Example 29 wherein one or more contacts of the first set are each connected to multiple corresponding vias of the array, so that substantially equal via current magnitudes flow through each of the multiple vias that are connected to the same contact.

Example 32. The device of Example 31 wherein (i) the vias of the array are arranged in multiple rows and each row includes multiple vias, (ii) each row extends across the device along a first transverse dimension and the multiple rows are arranged across the device along a second, orthogonal transverse dimension, (iii) each via of a given row is connected to the same corresponding contact of the first set, and (iv) each row of vias is connected to a corresponding contact of the first set that is different from a corresponding contact of the first set connected to at least one other row of vias.

Example 33. The device of Example 32 wherein the drive circuit is structured and connected so that a corresponding sum of via current magnitude flowing through the vias of each row decreases monotonically across the device along the second transverse dimension.

Example 34. The device of any one of Examples 29 through 33 wherein the drive circuit is structured and connected so that each via current magnitude is either (i) substantially equal to a specified minimum via current magnitude or (ii) substantially equal to a specified maximum via current magnitude greater than the specified minimum current magnitude.

Example 35. The device of any one of Examples 29 through 33 wherein the drive circuit is structured and connected so that each via current magnitude is (i) substantially equal to a specified minimum via current magnitude, (ii) substantially equal to a specified maximum via current magnitude greater than the specified minimum current magnitude, or (iii) substantially equal to one of one or more discrete specified intermediate via current magnitudes that are between the specified minimum current magnitude and the specified maximum via current magnitude.

Example 36. The device of any one of Examples 29 through 33 wherein the drive circuit is structured and connected so that each via current magnitude is within a continuous range from a specified minimum via current magnitude to a specified maximum via current magnitude greater than the specified minimum current magnitude.

Example 37. The device of any one of Examples 35 or 36 wherein the drive circuit is structured and connected so as to provide to each via of the array a corresponding specified via current magnitude between the specified minimum and maximum current magnitudes by applying the specified minimum and maximum via current magnitudes alternating at a frequency above about 60 Hz and with a corresponding duty cycle between zero and one.

Example 38. The device of any one of Examples 34 through 37 wherein the drive circuit is structured and connected so that the minimum specified via current magnitude is substantially equal to zero.

Example 39. The device of any one of Examples 29 through 38 wherein (i) the drive circuit is structured and connected so as to provide one or more specified spatial distributions across the device of the via current magnitudes provided by the drive circuit to the corresponding vias of the array, and (ii) spatial distribution of light emission intensity varies across the device according to the arrangement of the array of vias across the device and the specified distribution among the vias of the array of the via current magnitudes provided by the drive circuit.

Example 40. The device of Example 39 wherein the one or more specified spatial distributions of via current magnitudes includes a specified spatial distribution that results in a corresponding spatial distribution of light emission intensity that decreases along one transverse dimension across the device from the vias of the array closest to one edge of the device toward an opposite edge of the device.

Example 41. The device of any one of Examples 39 or 40 wherein the one or more specified spatial distributions of via current magnitudes includes a specified spatial distribution that results in a corresponding spatial distribution of emitted light intensity that exhibits a maximum intensity along a line extending across a central region of the device and decreases in both directions along one transverse dimension toward opposite edges of the device.

Example 42. The device of any one of Examples 39 through 41 wherein the one or more specified spatial distributions of via current magnitudes includes a specified spatial distribution that results in a corresponding spatial distribution of emitted light intensity that exhibits a maximum intensity at a central region of the device and decreases in both directions along both transverse dimensions toward edges of the device.

Example 43. The device of any one of Examples 39 through 42 wherein the drive circuit is arranged so as to provide only a single specified spatial distribution across the device of the corresponding magnitudes of the via currents, so that the device is arranged so as to provide only a single corresponding spatial distribution of light emission intensity across the device.

Example 44. The device of any one of Examples 39 through 42 wherein the drive circuit is arranged so as to enable dynamic switching among two or more different specified spatial distributions of via current magnitudes provided by the drive circuit, thereby enabling dynamic alteration the spatial distribution of light emission intensity across the device.

Example 45. A method for using the device of Example 44, the method comprising: (A) selecting a first specified spatial distribution of via current magnitudes; (B) operating the drive circuit to provide the first specified spatial distribution of via current magnitudes to the vias of the array, thereby causing the device to emit light according to a corresponding first spatial distribution of light emission intensity across the device; (C) selecting a second specified spatial distribution of via current magnitudes that differs from the first specified spatial distribution of via current magnitudes; and (D) operating the drive circuit to provide the second specified spatial distribution of via current magnitudes to the vias of the array, thereby causing the device to emit light according to a corresponding second spatial distribution of light emission intensity across the device that differs from the first spatial distribution of light emission intensity.

Example 46. A method for using the device of any one of Examples 43 or 44, the method comprising operating the drive circuit to provide a specified spatial distribution of via current magnitudes to the vias of the array, thereby causing the device to emit light according to a corresponding spatial distribution of light emission intensity across the device.

Example 47. A method for making the light-emitting device of any one of Examples 1 through 28, the method comprising: (A) forming the first and second doped semiconductor layers with the junction between them; (B) forming the array of vias connected to the first doped semiconductor layer; (C) forming the first set of contacts connected to the first doped semiconductor layer by the array of vias;

and (D) forming the second set of contacts connected to the second doped semiconductor layer.

Example 48. A method for making the light-emitting device of any one of Examples 29 through 45, the method comprising connecting the drive circuit to the first and second sets of contacts of the light-emitting device, and arranging the drive circuit to provide a specified spatial distribution of via current magnitudes to the vias of the array.

Example 49. A semiconductor light-emitting apparatus comprising: (a) n-doped and p-doped semiconductor layers that are arranged for emitting light resulting from carrier recombination at a junction between the n-doped and p-doped semiconductor layers; (b) a first set of one or more electrically conductive contacts each electrically connected to the p-doped semiconductor layer, and a second set of one or more electrically conductive contacts each electrically connected to the n-doped semiconductor layer; and (c) an array of multiple electrically conductive vias arranged across the device, the vias of the array connecting contacts of the first set to the p-doped semiconductor layer, each via being arranged so as to provide a corresponding discrete, localized, circumscribed electrical connection between the p-doped semiconductor layer and the corresponding contact of the first set, (d) wherein the array of vias is arranged across the device so that one or both of via local number density or via transverse area varies according to position across the device and results in a corresponding spatial distribution of light emission intensity that varies across the device according to the arrangement of the array of vias.

Example 50. The device of Example 49 wherein further comprising an electrically insulating layer between the p-doped semiconductor layer and the first set of contacts, wherein the vias connect contacts of the first set to the p-doped semiconductor layer through the insulating layer.

Example 51. The device of Example 50 wherein the contacts of the first set are metal contacts, and the first set of contacts and the insulating layer are arranged so as to act as a composite optical reflector for light emitted by the device.

Example 52. The device of Example 51 further comprising an electrode layer between the p-doped semiconductor layer and the insulating layer and in contact with the p-doped semiconductor layer, wherein the electrode layer is substantially transparent for light emitted by the device, and the vias of the array connect the p-doped semiconductor layer to contacts of the first set by connecting the electrode layer to contacts of the first set.

Example 53. The device of Example 52 wherein the electrode layer includes indium tin oxide or indium zinc oxide.

Example 54. The device of any one of Examples 49 through 53 wherein the insulating layer includes doped or undoped silica.

Example 55. The device of any one of Examples 49 through 54 wherein the p-doped semiconductor layer includes one or more doped III-V semiconductor materials or alloys thereof, and the n-doped semiconductor layer includes one or more III-V semiconductor materials or alloys thereof.

Example 56. The device of any one of Examples 49 through 55 wherein the first set of contacts includes one or more edge contacts.

Example 57. The device of any one of Examples 49 through 56 wherein the second set of contacts includes one or more edge contacts or areal contacts.

Example 58. The device of any one of Examples 49 through 57 further comprising a second array of multiple electrically conductive vias arranged across the device, the vias of the second array connecting contacts of the second set to the n-doped semiconductor layer, each via of the second set being arranged so as to provide a corresponding discrete, localized, circumscribed electrical connection between the n-doped semiconductor layer and a corresponding contact of the second set.

Example 59. A method for using the device of any one of Examples 49 through 58, the method comprising applying a common drive signal to the first set of one or more contacts, thereby causing the device to emit light according to the corresponding spatial distribution of light emission intensity across the device.

Example 60. A method for making the light-emitting device of any one of Examples 49 through 58, the method comprising: (A) forming the n-doped and p-doped semiconductor layers with the junction between them; (B) forming the array of vias connected to the p-doped semiconductor layer; (C) forming the first set of one or more contacts connected to the p-doped semiconductor layer by the array of vias; and (D) forming the second set of one or more contacts connected to the n-doped semiconductor layer.

It is intended that equivalents of the disclosed example embodiments and methods shall fall within the scope of the present disclosure or appended claims. It is intended that the disclosed example embodiments and methods, and equivalents thereof, may be modified while remaining within the scope of the present disclosure or appended claims.

In the foregoing Detailed Description, various features may be grouped together in several example embodiments for the purpose of streamlining the disclosure. This method of disclosure is not to be interpreted as reflecting an intention that any claimed embodiment requires more features than are expressly recited in the corresponding claim. Rather, as the appended claims reflect, inventive subject matter may lie in less than all features of a single disclosed example embodiment. Therefore, the present disclosure shall be construed as implicitly disclosing any embodiment having any suitable subset of one or more features—which features are shown, described, or claimed in the present application—including those subsets that may not be explicitly disclosed herein. A "suitable" subset of features includes only features that are neither incompatible nor mutually exclusive with respect to any other feature of that subset. Accordingly, the appended claims are hereby incorporated into the Detailed Description, with each claim standing on its own as a separate disclosed embodiment. In addition, each of the appended dependent claims shall be interpreted, only for purposes of disclosure by said incorporation of the claims into the Detailed Description, as if written in multiple dependent form and dependent upon all preceding claims with which it is not inconsistent. It should be further noted that the cumulative scope of the appended claims can, but does not necessarily, encompass the whole of the subject matter disclosed in the present application.

The following interpretations shall apply for purposes of the present disclosure and appended claims. The article "a" shall be interpreted as "one or more" unless "only one," "a single," or other similar limitation is stated explicitly or is implicit in the particular context; similarly, the article "the" shall be interpreted as "one or more of the" unless "only one of the," "a single one of the," or other similar limitation is stated explicitly or is implicit in the particular context. The conjunction "or" is to be construed inclusively (e.g., "a dog or a cat" would be interpreted as "a dog, or a cat, or both"; e.g., "a dog, a cat, or a mouse" would be interpreted as "a dog, or a cat, or a mouse, or any two, or all three"), unless:

(i) it is explicitly stated otherwise, e.g., by use of "either . . . or," "only one of," or similar language; or (ii) two or more of the listed alternatives are mutually exclusive within the particular context, in which case "or" would encompass only those combinations involving non-mutually-exclusive alternatives. Similarly, "one or more of a dog or a cat" or "one or more dogs or cats" would be interpreted as including (i) one or more dogs without any cats, (ii) one or more cats without any dogs, or (iii) one or more dogs and one or more cats, unless explicitly stated otherwise or the alternatives are understood or disclosed (implicitly or explicitly) to be mutually exclusive or incompatible. Similarly, "one or more of a dog, a cat, or a mouse" or "one or more dogs, cats, or mice" would be interpreted as (i) one or more dogs without any cats or mice, (ii) one or more cats without and dogs or mice, (iii) one or more mice without any dogs or cats, (iv) one or more dogs and one or more cats without any mice, (v) one or more dogs and one or more mice without any cats, (vi) one or more cats and one or more mice without any dogs, or (vii) one or more dogs, one or more cats, and one or more mice. "Two or more of a dog, a cat, or a mouse" or "two or more dogs, cats, or mice" would be interpreted as (i) one or more dogs and one or more cats without any mice, (ii) one or more dogs and one or more mice without any cats, (iii) one or more cats and one or more mice without and dogs, or (iv) one or more dogs, one or more cats, and one or more mice; "three or more," "four or more," and so on would be analogously interpreted. For any of the preceding recitations, if any pairs or combinations of the included alternatives are understood or disclosed (implicitly or explicitly) to be incompatible or mutually exclusive, such pairs or combinations are understood to be excluded from the corresponding recitation. For purposes of the present disclosure and appended claims, the words "comprising," "including," "having," and variants thereof, wherever they appear, shall be construed as open ended terminology, with the same meaning as if a phrase such as "at least" were appended after each instance thereof, unless explicitly stated otherwise.

For purposes of the present disclosure or appended claims, when terms are employed such as "about equal to," "substantially equal to," "greater than about," "less than about," and so forth, in relation to a numerical quantity, standard conventions pertaining to measurement precision and significant digits shall apply, unless a differing interpretation is explicitly set forth. For null quantities described by phrases such as "substantially prevented," "substantially absent," "substantially eliminated," "about equal to zero," "negligible," and so forth, each such phrase shall denote the case wherein the quantity in question has been reduced or diminished to such an extent that, for practical purposes in the context of the intended operation or use of the disclosed or claimed apparatus or method, the overall behavior or performance of the apparatus or method does not differ from that which would have occurred had the null quantity in fact been completely removed, exactly equal to zero, or otherwise exactly nulled.

For purposes of the present disclosure and appended claims, any labelling of elements, steps, limitations, or other portions of an embodiment, example, or claim (e.g., first, second, third, etc., (a), (b), (c), etc., or (i), (ii), (iii), etc.) is only for purposes of clarity, and shall not be construed as implying any sort of ordering or precedence of the portions so labelled. If any such ordering or precedence is intended, it will be explicitly recited in the embodiment, example, or claim or, in some instances, it will be implicit or inherent based on the specific content of the embodiment, example, or claim. In the appended claims, if the provisions of 35 USC § 112(f) are desired to be invoked in an apparatus claim, then the word "means" will appear in that apparatus claim. If those provisions are desired to be invoked in a method claim, the words "a step for" will appear in that method claim. Conversely, if the words "means" or "a step for" do not appear in a claim, then the provisions of 35 USC § 112(f) are not intended to be invoked for that claim.

If any one or more disclosures are incorporated herein by reference and such incorporated disclosures conflict in part or whole with, or differ in scope from, the present disclosure, then to the extent of conflict, broader disclosure, or broader definition of terms, the present disclosure controls. If such incorporated disclosures conflict in part or whole with one another, then to the extent of conflict, the later-dated disclosure controls.

The Abstract is provided as required as an aid to those searching for specific subject matter within the patent literature. However, the Abstract is not intended to imply that any elements, features, or limitations recited therein are necessarily encompassed by any particular claim. The scope of subject matter encompassed by each claim shall be determined by the recitation of only that claim.

What is claimed is:

1. A semiconductor light-emitting device (LED) comprising:
   (a) first and second doped semiconductor layers that are arranged for emitting light resulting from carrier recombination at a junction between the first and second doped semiconductor layers;
   (b) a first set of multiple independent electrically conductive contacts each electrically connected to the first doped semiconductor layer;
   (c) a second set of one or more electrically conductive contacts each electrically connected to the second doped semiconductor layer;
   (d) an array of multiple electrically conductive vias arranged across the device, the vias of the array connecting contacts of the first set to the first doped semiconductor layer, each via connecting at most one corresponding contact of the first set to the first doped semiconductor layer, each via being arranged so as to provide a corresponding discrete, localized, circumscribed electrical connection between the first doped semiconductor layer and the corresponding contact of the first set; and
   (e) a drive circuit connected to the first and second sets of contacts that is structured and connected so as to provide electrical drive current that flows through the device and causes the device to emit light, and that is further structured and connected so that (i) corresponding portions of the electrical drive current flow through one or more vias of the array as corresponding via currents, and (ii) each via current magnitude differs from the corresponding via current magnitude of at least one other of the vias of the array.

2. The device of claim 1 wherein the array of vias is arranged across the device as a substantially regular grid of substantially identical vias.

3. The device of claim 1 wherein (i) the first doped semiconductor layer is between the first set of contacts and the second doped semiconductor layer, (ii) the device further comprises an electrically insulating layer between the first doped semiconductor layer and the first set of contacts, and (iii) the vias connect contacts of the first set to the first doped semiconductor layer through the insulating layer.

4. The device of claim 3 wherein the contacts of the first set are metal contacts, and the first set of contacts and the insulating layer are arranged so as to act as a composite optical reflector for light emitted by the device.

5. The device of claim 3 further comprising an electrode layer between the first doped semiconductor layer and the insulating layer and in contact with the first doped semiconductor layer, wherein the electrode layer is substantially transparent for light emitted by the device, and the vias of the array connect the first doped semiconductor layer to contacts of the first set by connecting the electrode layer to contacts of the first set.

6. The device of claim 5 wherein (i) the electrode layer is arranged as multiple discrete areal segments separated by electrically insulating material so that transverse electrical conduction between adjacent areal segments is substantially prevented, and (ii) each areal segment of the electrode layer is connected to at most one corresponding contact of the first set.

7. The device of claim 1 wherein (i) the second doped semiconductor layer is between the first set of contacts and the first doped semiconductor layer, (ii) the device further comprises an electrically insulating layer between the second doped semiconductor layer and the first set of contacts, (iii) the vias connect contacts of the first set to the first doped semiconductor layer through the insulating layer and the second doped semiconductor layer, and (iv) the vias are electrically insulated from the second doped semiconductor layer.

8. The device of claim 1 further comprising a second array of multiple electrically conductive vias arranged across the device, the vias of the second array connecting contacts of the second set to the second doped semiconductor layer, each via of the second set being arranged so as to provide a corresponding discrete, localized, circumscribed electrical connection between the second doped semiconductor layer and a corresponding contact of the second set.

9. The device of claim 8 wherein the second set of contacts includes multiple independent electrically conductive contacts, each via of the second array connecting at most one corresponding contact of the second set to the second doped semiconductor layer.

10. The device of claim 1 wherein each contact of the first set is connected to at most one via of the array so as to enable the corresponding via current magnitude to flow through each via independent of via current magnitudes flowing through the other vias of the array.

11. The device of claim 1 wherein one or more contacts of the first set are each connected to multiple corresponding vias of the array, so that substantially equal via current magnitudes flow through each of the multiple vias that are connected to the same contact.

12. The device of claim 1 wherein the drive circuit is structured and connected so that each via current magnitude is either (i) substantially equal to a specified minimum via current magnitude or (ii) substantially equal to a specified maximum via current magnitude greater than the specified minimum current magnitude.

13. The device of claim 1 wherein the drive circuit is structured and connected so that each via current magnitude is (i) substantially equal to a specified minimum via current magnitude, (ii) substantially equal to a specified maximum via current magnitude greater than the specified minimum current magnitude, (iii) substantially equal to one of one or more discrete specified intermediate via current magnitudes that are between the specified minimum current magnitude and the specified maximum via current magnitude, or (iv) within a continuous range from a specified minimum via current magnitude to a specified maximum via current magnitude greater than the specified minimum current magnitude.

14. The device of claim 1 wherein (i) the drive circuit is structured and connected so as to provide one or more specified spatial distributions across the device of the via current magnitudes provided by the drive circuit to the corresponding vias of the array, and (ii) spatial distribution of light emission intensity varies across the device according to the arrangement of the array of vias across the device and the specified distribution among the vias of the array of the via current magnitudes provided by the drive circuit.

15. The device of claim 14 wherein the one or more specified spatial distributions of via current magnitudes includes a specified spatial distribution that results in a corresponding spatial distribution of light emission intensity that (i) decreases along one transverse dimension across the device from the vias of the array closest to one edge of the device toward an opposite edge of the device, (ii) exhibits a maximum intensity along a line extending across a central region of the device and decreases in both directions along one transverse dimension toward opposite edges of the device, or (iii) exhibits a maximum intensity at a central region of the device and decreases in both directions along both transverse dimensions toward edges of the device.

16. The device of claim 14 wherein the drive circuit is arranged so as to provide only a single specified spatial distribution across the device of the corresponding magnitudes of the via currents, so that the device is arranged so as to provide only a single corresponding spatial distribution of light emission intensity across the device.

17. The device of claim 14 wherein the drive circuit is arranged so as to enable dynamic switching among two or more different specified spatial distributions of via current magnitudes provided by the drive circuit, thereby enabling dynamic alteration the spatial distribution of light emission intensity across the device.

18. A method for using the device of claim 17, the method comprising:
(A) selecting a first specified spatial distribution of via current magnitudes;
(B) operating the drive circuit to provide the first specified spatial distribution of via current magnitudes to the vias of the array, thereby causing the device to emit light according to a corresponding first spatial distribution of light emission intensity across the device;
(C) selecting a second specified spatial distribution of via current magnitudes that differs from the first specified spatial distribution of via current magnitudes; and
(D) operating the drive circuit to provide the second specified spatial distribution of via current magnitudes to the vias of the array, thereby causing the device to emit light according to a corresponding second spatial distribution of light emission intensity across the device that differs from the first spatial distribution of light emission intensity.

19. A method for using the device of claim 14, the method comprising operating the drive circuit to provide a specified spatial distribution of via current magnitudes to the vias of the array, thereby causing the device to emit light according to a corresponding spatial distribution of light emission intensity across the device.

20. A semiconductor light-emitting apparatus comprising:
(a) n-doped and p-doped semiconductor layers that are arranged for emitting light resulting from carrier recombination at a junction between the n-doped and p-doped semiconductor layers;

(b) a first set of one or more electrically conductive contacts each electrically connected to the p-doped semiconductor layer, and a second set of one or more electrically conductive contacts each electrically connected to the n-doped semiconductor layer; and (c) an array of multiple electrically conductive vias arranged across the device, the vias of the array connecting contacts of the first set to the p-doped semiconductor layer, each via being arranged so as to provide a corresponding discrete, localized, circumscribed electrical connection between the p-doped semiconductor layer and the corresponding contact of the first set, (d) wherein the array of vias is arranged across the device so that one or both of via local number density or via transverse area varies according to position across the device and results in a corresponding spatial distribution of light emission intensity that varies across the device according to the arrangement of the array of vias.

21. The device of claim 20 wherein further comprising an electrically insulating layer between the p-doped semiconductor layer and the first set of contacts, wherein the vias connect contacts of the first set to the p-doped semiconductor layer through the insulating layer.

22. The device of claim 21 wherein the contacts of the first set are metal contacts, and the first set of contacts and the insulating layer are arranged so as to act as a composite optical reflector for light emitted by the device.

23. The device of claim 22 further comprising an electrode layer between the p-doped semiconductor layer and the insulating layer and in contact with the p-doped semiconductor layer, wherein the electrode layer is substantially transparent for light emitted by the device, and the vias of the array connect the p-doped semiconductor layer to contacts of the first set by connecting the electrode layer to contacts of the first set.

24. The device of claim 20 further comprising a second array of multiple electrically conductive vias arranged across the device, the vias of the second array connecting contacts of the second set to the n-doped semiconductor layer, each via of the second set being arranged so as to provide a corresponding discrete, localized, circumscribed electrical connection between the n-doped semiconductor layer and a corresponding contact of the second set.

* * * * *

UNITED STATES PATENT AND TRADEMARK OFFICE
CERTIFICATE OF CORRECTION

PATENT NO. : 11,462,666 B2
APPLICATION NO. : 16/875237
DATED : October 4, 2022
INVENTOR(S) : Toni Lopez and Floris Crompvoets It is certified that error appears in the above-identified patent and that said Letters Patent is hereby corrected as shown below:

In the Claims

In Claim 21 1st Line (Column 27 Line 23):
Please delete "wherein"

Signed and Sealed this
Twenty-third Day of April, 2024

Katherine Kelly Vidal
*Director of the United States Patent and Trademark Office*